(12) United States Patent
Cao

(10) Patent No.: US 9,406,759 B2
(45) Date of Patent: Aug. 2, 2016

(54) METHODS FOR FORMING NANOCRYSTALS WITH POSITION-CONTROLLED DOPANTS

(75) Inventor: Y. Charles Cao, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 1342 days.

(21) Appl. No.: 12/376,371

(22) PCT Filed: Aug. 30, 2007

(86) PCT No.: PCT/US2007/077263
§ 371 (c)(1),
(2), (4) Date: May 26, 2009

(87) PCT Pub. No.: WO2008/028054
PCT Pub. Date: Mar. 6, 2008

(65) Prior Publication Data
US 2010/0055462 A1     Mar. 4, 2010

Related U.S. Application Data

(60) Provisional application No. 60/841,118, filed on Aug. 30, 2006.

(51) Int. Cl.
*C30B 7/14* (2006.01)
*H01L 29/225* (2006.01)
*C09K 11/02* (2006.01)
*C09K 11/56* (2006.01)
*C09K 11/57* (2006.01)
(Continued)

(52) U.S. Cl.
CPC ............. *H01L 29/225* (2013.01); *C09K 11/02* (2013.01); *C09K 11/565* (2013.01); *C09K 11/574* (2013.01); *H01L 21/242* (2013.01); *H01L 21/40* (2013.01); *H01L 21/02521* (2013.01); *H01L 21/02601* (2013.01); *Y10T 428/2991* (2015.01)

(58) Field of Classification Search
CPC ........ C30B 29/60; C30B 29/68; C30B 31/00; C30B 31/04; C09K 11/00; C09K 11/02; C09K 11/08; C09K 11/565; C09K 11/574; H01L 21/40
USPC .............. 117/11, 12, 68–70, 956, 2; 977/700, 977/773–777, 824, 825
See application file for complete search history.

(56) References Cited

U.S. PATENT DOCUMENTS 5,105,434 A    4/1992  Krupke et al.
6,072,817 A    6/2000  Adachi et al.
(Continued)

OTHER PUBLICATIONS

S.C. Erwin, et al. publication entitled "Doping of semiconductor nanocrystals," Nature Letters, vol. 436, pp. 91-94, Jul. 7, 2005.*
(Continued)

*Primary Examiner* — Kenneth A Bratland, Jr.
(74) *Attorney, Agent, or Firm* — Saliwanchik, Lloyd & Eisenschenk

(57) ABSTRACT

A doping method using a three-step synthesis to make high-quality doped nanocrystals is provided. The first step includes synthesizing starting host particles. The second step includes dopant growth on the starting host particles. The third step includes final shell growth. In one embodiment, this method can be used to form Mn-doped CdS/ZnS core/shell nanocrystals. The Mn dopant can be formed inside the CdS core, at the core/shell interface, and/or in the ZnS shell. The subject method allows precisely controlling the impurity radial position and doping level in the nanocrystals.

15 Claims, 8 Drawing Sheets

(51) Int. Cl.
H01L 21/24 (2006.01)
H01L 21/40 (2006.01)
H01L 21/02 (2006.01)

(56) References Cited

U.S. PATENT DOCUMENTS

| | | | |
|---|---|---|---|
| 6,322,901 B1 * | 11/2001 | Bawendi | C01B 17/20 257/E33.004 |
| 6,440,828 B1 | 8/2002 | Sato et al. | |
| 6,780,242 B2 | 8/2004 | Norris | |
| 6,780,698 B2 | 8/2004 | Suwa et al. | |
| 7,005,669 B1 | 2/2006 | Lee | |
| 7,033,415 B2 | 4/2006 | Mirkin et al. | |
| 7,621,997 B2 * | 11/2009 | Jun | B82Y 30/00 117/68 |
| 2005/0129947 A1 * | 6/2005 | Peng | B82Y 15/00 428/403 |
| 2005/0189534 A1 * | 9/2005 | Guyot-Sionnest | H01L 31/0352 257/21 |
| 2007/0194279 A1 * | 8/2007 | Peng | C09K 11/02 252/301.4 F |

OTHER PUBLICATIONS

Murray, C.B. et al., "Colloidal synthesis of nanocrystals and nanocrystal superlattices," *IBM J. Res. & Dev.*, Jan. 2001, vol. 45, No. 1, pp. 47-56.
Norris, D.J. et al., "High-quality manganese-doped ZnSe nanocrystals," *Nano Letters*, 2001, vol. 1, pp. 3-7.
Shim, M. et al., "Doping and charging in colloidal semiconductor nanocrystals," *MRS Bulletin*, 2001, vol. 26, pp. 1005-1008.
Bawendi, M.G. et al., "The quantum mechanics of larger semiconductor clusters ("quantum dots")," *Annu. Rev. Phys. Chem.*, 1990, vol. 41, pp. 477-496.
Alivisatos, A.P., "Perspectives on the physical chemistry of semiconductor nanocrystals," *J. Phys. Chem.*, 1996, vol. 100, pp. 13226-13229.
El-Sayed, M.A., "Small is different: shape-, size-, and composition-dependent properties of some colloidal semiconductor nanocrystals," *Acc. Chem. Res.*, 2004, vol. 37, pp. 326-333.
Murray, C.B. et al., "Synthesis and characterization of nearly monodisperse CdE (E=S, Se, Te) semiconductor nanocrystallites," *J. Am. Chem. Soc.*, 1993, vol. 115, pp. 8706-8715.
Peng, Z.A. et al, "Formation of high-quality CdTe, CdSe, and CdS nanocrystals using CdO as precursor," *J. Am. Chem. Soc.*, 2001, vol. 123, pp. 183-184.
Cao, Y.C. et al., "One-Pot Synthesis of High-Quality Zinc-Blende CdS Nanocrystals," *J. Am. Chem. Soc.*, 2004, vol. 126, pp. 14336-14337.
Du, H. et al., "Optical Properties of Colloidal PbSe Nanocrystals," *Nano Letters*, 2002, vol. 2, pp. 1321-1324.
Hines, M.A. et al., "Colloidal PbS nanocrystals with size-tunable Near-Infrared Emission: Observation of post-synthesis self-narrowing of the particle size distribution," *Adv. Mater.*, 2003, vol. 15, pp. 1844-1849.
Cao, Y. et al., "Growth and properties of semiconductor core/shell nanocrystals with InAs cores," *J. Am. Chem.*, 2000, vol. 122, pp. 9692-9702.
Kim, Y.-H. et al., "Sterically Induced Shape and Crystalline Phase Control of GaP Nanocrystals," *J. Am. Chem. Soc.*, 2002, vol. 124, pp. 13656-13657.
Han, M. et al., "Quantum-dot-tagged microbeads for multiplexed optical coding of biomolecules," *Nat Biotechnol*, 2001, vol. 19, pp. 631-635.
Alivisatos, P., "The use of nanocrystals in biological detection," *Nat Biotechnol*, 2004, vol. 22, pp. 47-52.
Klimov, V.I. et al., "Optical gain and stimulated emission in nanocrystal quantum dots," *Science*, 2000, vol. 290, pp. 314-317.
Zhu, L. et al., "Light-controlled Molecular Switches Modulate Nanocrystal Fluorescence," *J. Am. Chem. Soc.*, 2005, vol. 127, pp. 8968-8970.
Wang, C. et al., "Electrochromic nanocrystal quantum dots," *Science*, 2001, vol. 291, pp. 2390-2392.
Dickson, R.M. et al., "Unidirectional Plasmon propagation in metallic nanowires," *J. Phys. Chem. B.*, 2000, vol. 104, pp. 6095-6098.
Colvin, V.L. et al., "Light-emitting diodes made from cadmium selenide nanocrystals and a semiconducting polymer," *Nature*, 1994, vol. 370, pp. 354-357.
Gugliotti, L.A. et al., "RNA-mediated metal-metal bond formation in the synthesis of hexagonal palladium nanoparticles," *Science*, 2004, vol. 304, pp. 850-852.
Klein, D.L. et al., "A single-electron transistor made from a cadmium selenide nanocrystal," *Nature*, 1997, vol. 389, pp. 699-701.
Wolf, S.A. et al., "Spintronics: a spin-based electronics vision for the future," *Science*, 2001, vol. 294, pp. 1488-1495.
Millo, O. et al., "Imaging and spectroscopy of artificial-atom states in core/shell nanocrystal quantum dots," *Phys. Rev. Lett.*, 2001, vol. 86, pp. 5751-5754.
Shim, M. et al., "n-type colloidal semiconductor nanocrystals," *Nature*, 2000, vol. 407, pp. 981-983.
Wehrenberg, B.L. et al., "Electron and hole injection in PbSe quantum dot films," *J. Am. Chem. Soc.*, 2003, vol. 125, pp. 7806-7807.
Yu, D. et al., "n-type conducting CdSe nanocrystal solids," *Science*, 2003, vol. 300, pp. 1277-1280.
Hoffman, D.M. et al., "Giant internal magnetic fields in Mn doped nanocrystal quantum dots," *Solid State Commun*, 2000, vol. 114, pp. 547-550.
Wang, Y. et al., "Three-dimensionally confined diluted magnetic semiconductor clusters: $Zn_{1-x}Mn_xS$," *Solid State Communications*, 1991, vol. 77, pp. 33-38.
Bhargava, R.N. et al., "Optical properties of manganese-doped nanocrystals of ZnS," *Phys. Rev. Lett.*, 1994, vol. 72, pp. 416-419.
Bhargava, R.N. et al., "Doped nanocrystals of semiconductors—a new class of luminescent materials," *J. Lumin.*, 1994, vols. 60-61, pp. 275-280.
Sooklal, K. et al., "Photophysical properties of ZnS nanoclusters with spatially localized $Mn^{2+}$," *J. Phys. Chem.*, 1996, vol. 100, pp. 4551-4555.
Levy, L. et al., "Control of the size and composition of three dimensionally diluted magnetic semiconductor clusters," *J. Phys. Chem.*, 1996, vol. 100, pp. 18322-18326.
Suyver, J.F. et al., "Luminescence of nanocrystalline $ZnSe:Mn^{2+}$," *Phys. Chem. Chem. Phys.*, 2000, vol. 2, pp. 5445-5448.
Stowell, C.A. et al., "Synthesis and characterization of dilute magnetic semiconductor manganese-doped indium arsenide nanocrystals," *Nano Letters*, 2003, vol. 3, pp. 1441-1447.
Hanif, K.M. et al., "Magnetic ordering in doped $Cd_{1-x}Co_xSe$ diluted magnetic quantum dots," *J. Am. Chem. Soc.*, 2002, vol. 124, pp. 11495-11502.
Meulenberg, R.W. et al., "Structure and composition of Cu-doped CdSe nanocrystals using soft X-ray absorption spectroscopy," *Nano Letters*, 2004, vol. 4, pp. 2277-2285.
Raola, O.E. et al., "Synthesis and characterization of Eu-doped cadmium selenide nanocrystals," *Nano Letters*, 2002, vol. 2, pp. 1443-1447.
Bol, A.A. et al., "On the incorporation of trivalent rare earth ions in II-VI semiconductor nanocrystals," *Chem Mater.*, 2002, vol. 14, pp. 1121-1126.
Counio, G. et al., "Synthesis and photoluminescence of $Cd_{1-x}Mn_xS$ (x≤5%) nanocrystals," *J. Phys. Chem. B.*, 1998, vol. 102, pp. 5257-5260.
Kittilstved, K.R. et al., "Activation of High-$T_c$ Ferromagnetism in $Mn^{2+}$-doped ZnO using Amines," *J. Am. Chem. Soc.*, 2005, vol. 127, pp. 5292-5293.
Schwartz, D.A. et al., "Magnetic Quantum Dots: Synthesis, Spectroscopy, and Magnetism of $Co^{2+}$—and $Ni^{2+}$—Doped ZnO Nanocrystals," *J. Am. Chem. Soc.*, 2003, vol. 125, pp. 13205-13218.
Radovanovic, P.V. et al., "Electronic absorption spectroscopy of cobalt ions in diluted magnetic semiconductor quantum dots: demonstration of an isocrystalline core/shell synthetic method," *J. Am. Chem. Soc.*, 2001, vol. 123, pp. 12207-12214.
Somaskandan, K. et al., "Isovalent doping strategy for manganese introduction into III-V diluted magnetic semiconductor nanoparticles: InP:Mn," *Chem. Mater.*, 2005, vol. 17, pp. 1190-1198.

(56) References Cited

OTHER PUBLICATIONS

Mikulec, F.V. et al., "Organometallic synthesis and spectroscopic characterization of manganese-doped CdSe nanocrystals," *J. Am. Chem. Soc.*, 2000, vol. 122, pp. 2532-2540.

Hwang, I. et al., "Solid solubilities of magnetic ions in diluted magnetic semiconductors grown under equilibrium conditions," *Phys. Rev. B.*, 1994, vol. 50, pp. 8849-8852, Abstract only.

Erwin, S.C. et al., "Doping semiconductor nanocrystals," *Nature*, 2005, vol. 436, pp. 91-94.

Yang, Y.A. et al., "Synthesis of CdSe and CdTe Nanocrystals without Precursor Injection," *Angew. Chem. Int. Ed.*, 2005, vol. 44, pp. 6712-6715.

Cao, Y. et al., "Synthesis and characterization of InAs/InP and InAs/CdSe core/shell nanocrystals," *Angew. Chem. Int. Ed.*, 1999, vol. 38, pp. 3692-3694.

Yu, W.W. et al., "Experimental Determination of the Extinction Coefficient of CdTe, CdSe, and CdS Nanocrystals," *Chem. Mater.*, 2003, vol. 15, pp. 2854-2860.

Xie, R. et al., "Synthesis and characterization of highly luminescent CdSe-Core CdS/$Zn_{0.5}Cd_{0.5}$S/ZnS Multishell Nanocrystals," *J. Am. Chem. Soc.*, 2005, vol. 127, pp. 7480-7488.

Demas, J. N. et al., "The measurement of photoluminescence quantum yields: A review," *J. Phys. Chem.*, 1971, vol. 75, pp. 991-1024.

Pradhan, N. et al., "An Alternative of CdSe Nanocrystal Emitters: Pure and Tunable Impurity Emissions in ZnSe Nanocrystals," *J. Am. Chem. Soc.*, 2005, vol. 127, pp. 17586-17587.

Yang, H. et al., "Enhanced photoluminescence from CdS:Mn/ZnS core/shell quantum dots," *Appl. Phys. Lett.*, 2003, vol. 82, pp. 1965-1967.

Ji, T. et al., "The First Synthesis of $Pb_{1-x}Mn_xSe$ Nanocrystals," *J. Am. Chem. Soc.*, 2003, vol. 125, pp. 8448-8449.

Lifshitz, E. et al., "Analysis of the electron spin resonance spectrum of manganese(II) impurity centers in the layered compound $CdPS_3$," *J. Phys. Chem.*, 1982, vol. 86, pp. 4714-4718.

Kremer, R.E. et al., "Investigation of EPR in $Cd_{1-x}Mn_xTe$ by microwave Faraday effect," *Phys. Rev. B.*, 1985, vol. 32, pp. 5591-5599, Abstract only.

Colvin, V.L., "The potential environmental impact of engineered nanomaterials," *Nat. Biotechnol.*, 2003, vol. 21, pp. 1166-1170.

Dalpian, G.M. et al., "Self-purification in semiconductor nanocrystals," *Phys. Rev. Lett.*, 2006, vol. 96, Article No. 226802.

Theodoropoulou, N. et al., "Unconventional carrier-mediated ferromagnetism above room temperature in ion-implanted (Ga, Mn)P:C," *Phys. Rev. Lett.*, 2002, vol. 89, No. 10, Article No. 107203.

Pearton, S.J. et al., "Room temperature ferromagnetism in GaMnN and GaMnP," *Physica Status Solidi A: Applied Research*, 2003, vol. 195, pp. 222-227.

Holub, M. et al., "Mn-doped InAs self-organized diluted magnetic quantum-dot layers with Curie temperatures above 300 K," *Appl. Phys. Lett.*, 2004, vol. 85, pp. 973-975.

Li, J.J. et al, "Large-scale synthesis of nearly monodisperse CdSe/CdS core/shell nanocrystals using air-stable reagents via successive ion layer adsorption and reaction," *J. Am. Chem. Soc.*, 2003, vol. 125, pp. 12567-12575.

\* cited by examiner

FIG. 4A
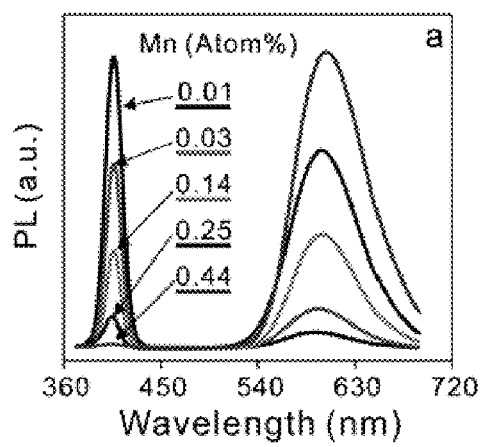
FIG. 4C
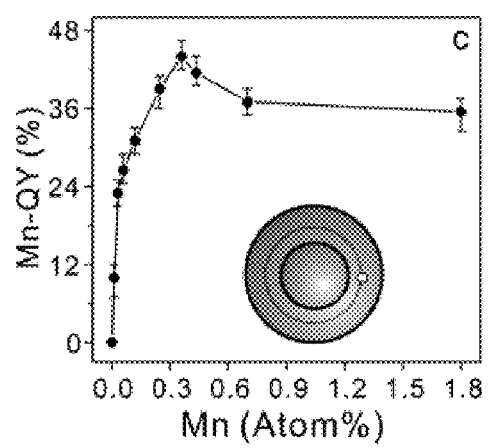
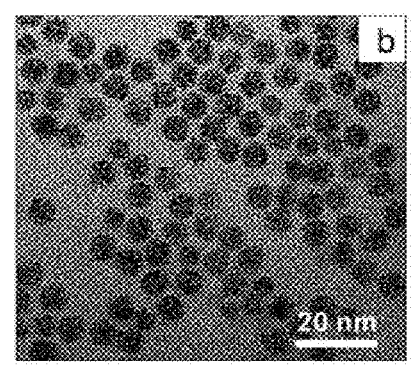
FIG. 4B
FIG. 4D
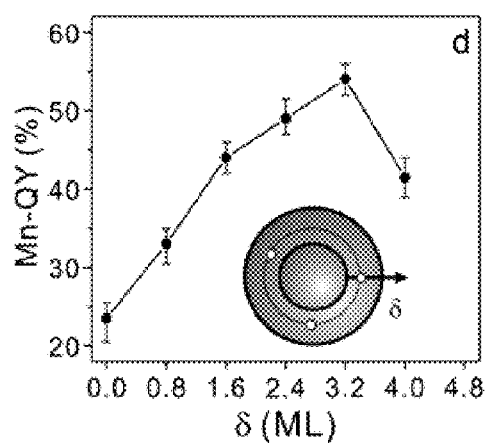
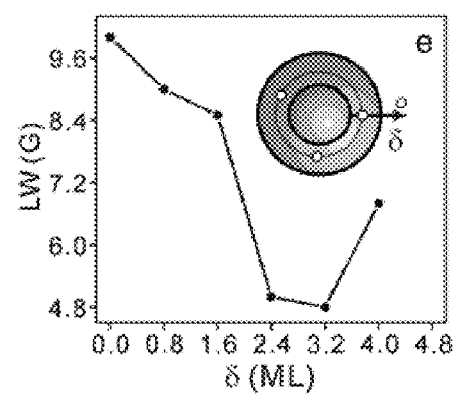
FIG. 4E

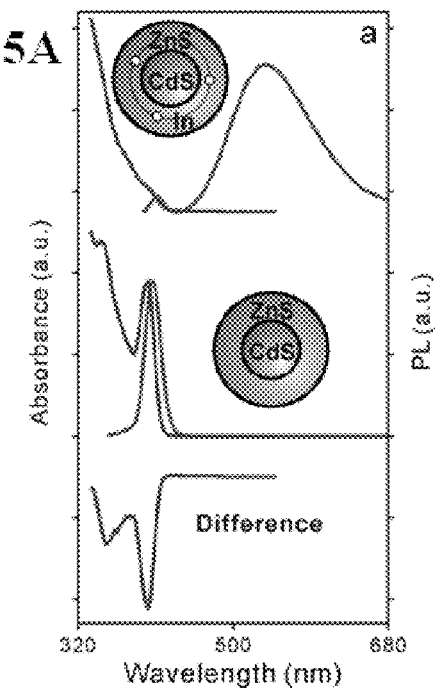
FIG. 5A
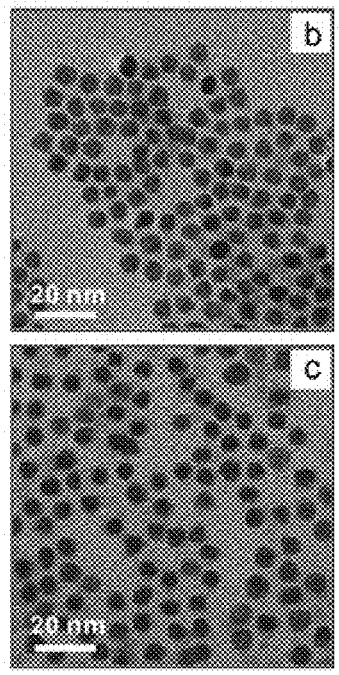
FIG. 5B
FIG. 5C
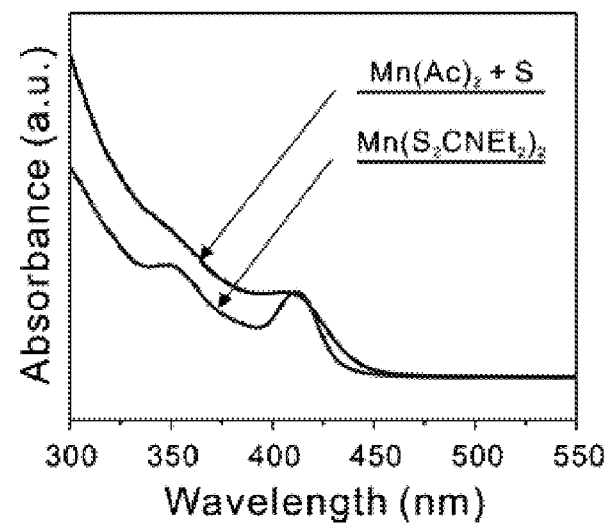
FIG. 6

FIG. 7A
FIG. 7B
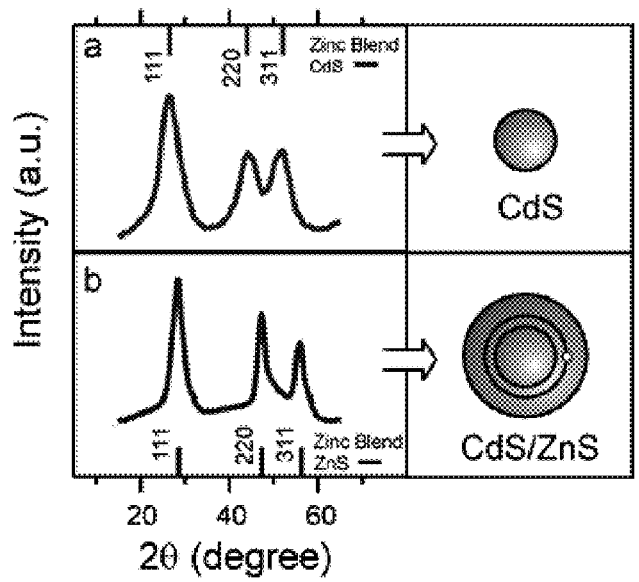
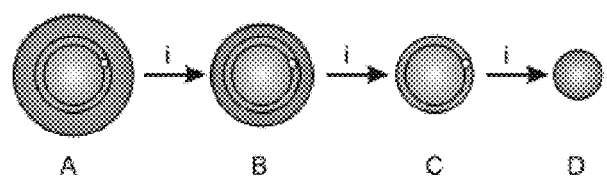
FIG. 8
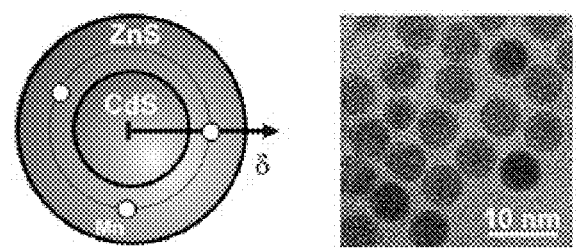
FIG. 9

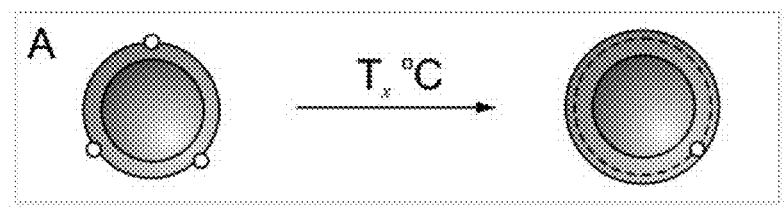
FIG. 11A
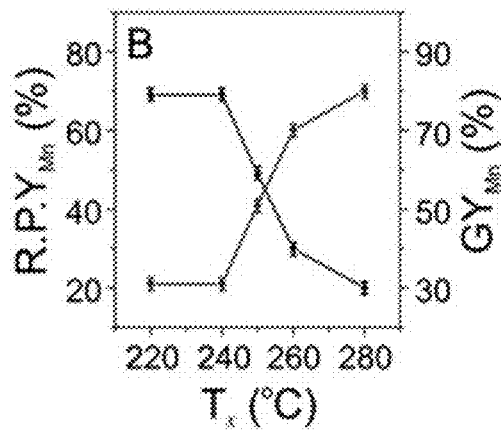
FIG. 11B
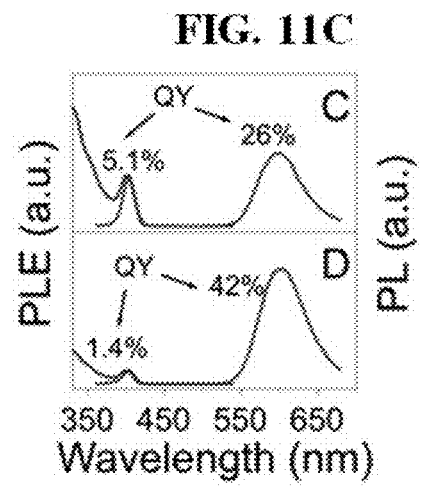
FIG. 11C
FIG. 11D

METHODS FOR FORMING NANOCRYSTALS WITH POSITION-CONTROLLED DOPANTS

CROSS REFERENCE TO RELATED APPLICATION

This application is a National Stage Application of International Application Number PCT/US2007/077263, filed Aug. 30, 2007; which claims the benefit of U.S. provisional patent application Ser. No. 60/841,118, filed Aug. 30, 2006, which are hereby incorporated by reference in their entirety.

FIELD OF THE INVENTION

The present invention relates to nanocrystals and methods of doping nanocrystals.

BACKGROUND OF INVENTION

In past decades, advances in synthetic strategies have resulted in the preparation of a variety of high-quality colloidal semiconductor nanocrystals with well-controlled size, shape, and surface passivation.[1-3] These nanocrystals range from II-VI (e.g., CdSe and CdTe), IV-VI (e.g., PbS and PbSe), and III-V (e.g., InAs and GaP) semiconductors.[4-10] Their novel properties have led to nanocrystals being used as biological fluorescent labels, chemical catalysts, separation reagents, structural building blocks, critical components in single-electron tunneling devices, solar cells, lasers, light-emitting diodes, as well as in many other applications.[11-19]

The potential for using nanocrystals in a wide variety of applications has stimulated research efforts to develop synthetic methods to incorporate dopants into a variety of colloidal semiconductor nanocrystals.[24, 29, 45, 47, 50, 58, 59, 60, 61, 62] It has been found that nanocrystals with dopants inside their crystal lattice can exhibit different properties from those with dopants on their surface.[24, 29, 45, 47, 50, 58, 59, 60, 61, 62]

In bulk semiconductors, the ability to precisely control impurity doping has enabled most modern semiconductor applications.[20] Doping with conventional impurities (donors and acceptors) allows the control of the number of carriers (electrons and holes) in semiconductors, which builds the foundation for p-n-junction-based semiconductor devices.[21] In addition, doping with magnetic impurities (e.g., Mn) allows the production of paramagnetic or even ferromagnetic semiconductor crystals,[22] which are important to spintronics applications.[23] Compared with conventional charge-based devices, spintronic devices allow faster data processing, less power consumption, and higher integration densities.[23] However, impurity doping in colloidal semiconductor nanocrystals remains to be fully mastered.[24]

Despite decades of experience in doping bulk semiconductors with conventional impurities, the extension of such doping to semiconductor nanocrystals has proved very difficult. So far, n- and p-type doping of semiconductor nanocrystals by conventional methods has been unsuccessful in colloidal nanocrystals, in part, because of the difficulties in introducing the impurities.[24] Alternatively, n- and p-type nanocrystals have been made by carrier injection.[26,27] Such doped nanocrystals exhibit very high collective conductivity (e.g. ~$10^{-2}$ siemens per centimeter) in thin films.[28]

Because of the difficulties in conventional-impurity doping, most efforts to date have focused on doping semiconductor nanocrystals with magnetic impurities.[24] Such efforts are inspired by the progress in bulk diluted magnetic semiconductors (DMS), which are potentially useful in magnetic switching and spintronics.[22,23] Typically, these magnetic impurities do not influence nanocrystal properties by introducing extra carriers, but by interacting with the quantum-confined electron-hole pair.[24] In addition, these magnetic impurities can act as paramagnetic centers in the semiconductor lattice.

So far, a variety of II-VI and III-V semiconductor nanocrystals have been doped with magnetic impurities, such as Mn, Co, Ni, Eu, and Tb.[29-48] A very large Zeeman effect, where atomic energy levels are split into a larger number of energy levels and the spectral lines are split into several components, has been observed in Mn-doped CdS and ZnSe nanocrystals.[29,30] The interpretation of such a large Zeeman effect is that the quantum-confined electron-hole pair feels an effective magnetic field up to 400 Tesla, which is caused by the presence of a few $Mn^{2+}$ ions in nanocrystals.[24,29]

In addition to magnetic properties, some magnetic dopants (e.g., $Mn^{2+}$ and $Eu^{2+}$) can also introduce new luminescence properties to nanocrystals.[29,41-43] Doping wide-gap II-VI semiconductor nanocrystals (e.g., ZnS and ZnSe) with these dopants can lead to the synthesis of nanocrystals with photoluminescence (PL) in the visible spectral region. These doped particles are much less toxic than the widely studied CdSe-based nanocrystals, and therefore they can be more important in nanocrystal-based applications such as biomedical diagnosis.[65] However, the typical PL quantum yield (QY) of these doped nanocrystals is lower than that of CdSe-based nanocrystals.[29] The low PL QY could limit the applications of these doped nanocrystals.[12] To date, synthesizing doped nanocrystals with a high PL QY remains a challenge.

Two types of synthetic methods have been used to make doped nanocrystals.[24] The first method is based on aqueous-phase coprecipitation or inverse micelle. This method often suffers from low crystallinity and broad size distributions.[24] The second method is organic-phase high-temperature growth, which can produce monodisperse and highly crystalline colloidal nanocrystals.[24] In many cases, the impurity atoms only exist at the surface of the nanocrystals but not inside the core, therefore minimizing the impurity's effects on the nanocrystal's properties.[24] An isocrystalline shell-growth method has been introduced to incorporate these surface impurities inside the cores.[46,47] Despite such progress, the synthesis of doped nanocrystals has not been fully understood. For example, manganese cannot be easily incorporated into a wurtzite CdSe nanocrystal even though manganese atoms have near 50% solubility in bulk CdSe crystals.[48,49] Recently, Erwin et al. suggested that surface kinetics play a key role in impurity doping of nanocrystals.[50] According to Erwin et al., the doping efficiency is determined by the initial adsorption of impurities on the nanocrystal surface during growth, and the binding energy of the impurity atom to specific surface facets is important to the adsorption.[50] However, very recently Chelikowsky et al. has suggested that self-purification is an intrinsic property of defects in semiconductor nanocrystals, and nanocrystal shape is not critical for incorporating dopants.[66]

Furthermore, impurity atoms are Just randomly absorbed into the nanocrystals during their growth.[37,50] Therefore, impurity atoms are randomly located inside a nanocrystal made by the current syntheses.[37,50] In addition, the current doping syntheses use a one-pot method.[50] The impurity precursor (the precursor containing impurity atoms) and intrinsic precursor (the precursor for making the major semiconductor lattice of the nanocrystals) are mixed during the entire doping synthesis.[24, 29, 30, 50] Therefore, impurity doping may occur during both nanocrystal nucleation and growth stages. The complexity of the nanocrystal nucleation[4,6] makes it very difficult to control doping levels in such a synthesis. Specifically, a high concentration of the impurity precursor (e.g., for making nanocrystals with a high doping level) could lead to nucleation of pure dopant materials. The nucleation of pure dopant materials would result in a broad distribution of doping levels among the nanocrystals (the amount of impurity atoms varies between different nanocrystals) in the same growth solution.

BRIEF SUMMARY

The present invention provides nanocrystals having position-controlled dopants and methods for producing same. The materials and methods of the subject invention address and/or substantially obviate one or more problems, limitations, and/or disadvantages of the prior art.

Advantageously, in one embodiment, the present invention provides a method for controlling the position of dopants in nanocrystals. The ability to precisely control the doping of semiconductor nanocrystals facilitates the production of functional materials with new properties, which are of importance to applications including, but not limited to, biomedical diagnosis, solar cells, and spintronics. For example, nanocrystals of the invention having high-emission quantum yield are important to such applications as nanocrystal-based biomedical diagnosis. Furthermore, the ability to control dopant positions inside semiconductor nanocrystals allows the precise control of the optical, electronic, and magnetic properties of the doped nanocrystals.

In one embodiment of the subject invention, there is provided a nanocrystal that comprises a core material; a plurality of dopant atoms radially positioned either within the core material, at the surface of the core material, and/or a distance from the surface of the core material; and an intrinsic shell surrounding the core material and plurality of dopant atoms, whereby the plurality of dopant atoms are embedded within the nanocrystal.

In another embodiment of the subject invention, there is provided a nanocrystal that comprises a spherical homogeneous structure and a plurality of dopant atoms radially positioned within the spherical homogenous structure and/or at the surface of the spherical homogenous structure. Additional material of the same type as the spherical homogenous structure can be provided surrounding the plurality of dopant atoms, whereby the additional material maintains the spherical homogenous structure.

In another aspect of the present invention, there is provided a method for forming a nanocrystal having position-controlled dopants, the method comprising synthesis of starting host particles; dopant growth; and host shell growth.

In yet another aspect of the present invention, there is provided methods for controlling dopant level and dopant position within nanocrystal particles. One method for controlling dopant level and dopant position comprises controlling the size of a starting host particle and the thickness of the host shell. A method for controlling dopant level, or concentration of dopant atoms in their host materials, includes selection of the amount of doping precursors in a doping solution, the reactivity of the doping precursors, the molar ratio of doping precursors to host precursors, reaction temperature, reaction time, and solvent.

BRIEF DESCRIPTION OF DRAWINGS

FIG. 1a shows a spherical nanocrystal with a homogeneous structure; and FIG. 1b shows a spherical nanocrystal with a core/shell structure.

FIG. 3a shows Mn position inside the CdS core, FIG. 3b shows Mn position at the core-shell interface, and FIG. 3c shows Mn position in ZnS shell; FIGS. 3d-3f show corresponding Mn position dependent PL spectra; and FIG. 3g shows the corresponding EPR spectra with an inset of the third peak.

FIGS. 4a-4e show the effects of Mn-doping level of CdS/ZnS core/shell nanocrystals according to embodiments of the subject invention. FIG. 4a shows a normalized PL spectra of Mn-doped CdS/ZnS core/shell nanocrystals with different doping levels; FIG. 4b shows a typical TEM image of the Mn-doped core/shell nanocrystals; FIG. 4c shows a plot of Mn QY as a function of doping level for these nanocrystals; FIG. 4d shows a plot of Mn QY as a function of Mn position ($\delta$) in the ZnS shell of the core/shell nanocrystals with a doping level of 0.36%; and FIG. 4e shows a plot of the EPR-peak line width (LW) as a function of Mn position ($\delta$) in the ZnS shell of the core/shell nanocrystals with a doping level of 0.36% and Mn located at 1.6 ML in the shell.

FIGS. 5a-5c show absorption spectrum and TEM images for indium doped and undoped CdS/ZnS core/shell nanocrystals. FIG. 5a shows Absorption and PL spectra of indium-doped (top) and un-doped (middle) CdS/ZnS core/shell nanocrystals, and the difference in the absorption spectra (bottom); and FIGS. 5b and 5c show TEM images of an indium-doped nanocrystal and an un-doped nanocrystal, respectively, with a CdS core diameter of 3.1 nm ($\sigma$~10%), ZnS-shell thickness of ~1.5 nm, and indium-doping level of 0.8%.

FIG. 6 shows a UV-Vis spectra of Mn-doped CdS nanocrystals made by using the less-active precursors ($Mn(Ac)_2$ and S at 280° C.) and the active precursor ($Mn(S_2CNEt_2)_2$ at 220° C.), respectively.

FIGS. 7a and 7b show XRD patterns. FIG. 7a shows a XRD pattern of a CdS core being 3.1 nm in diameter; and FIG. 7b shows a XRD pattern of a Mn-doped CdS/ZnS core/shell nanocrystal having ZnS-shell thickness of 4.8 monolayers and Mn-doping level of 0.36%.

FIG. 8 shows graphical representation of a scheme of controlled-chemical etching of a doped nanocrystal. A) The original particle; (B), (C), and (D) the particle after chemical etching i at different steps.

FIG. 9 shows a graphic representation of an Mn-doped CdS/ZnS core/shell nanocrystal (right) and a typical TEM image of the Mn-doped core/shell nanocrystals (left). The doping process disclosed in the subject application allows precise control over the Mn radial position and doping level in the core/shell nanocrystals.

FIG. 10A shows a plot with $Mn(OAc)_2$ and S as precursors and a reaction temperature of 220° C.; FIG. 10B shows a plot with $Mn(OAc)_2$ and S as precursors and a reaction temperature of 280° C.; FIG. 10C shows a plot with $Mn(S_2CNEt_2)_2$ as precursor and a reaction temperature of 220° C.; and FIG. 10D shows a plot with $Mn(S_2CNEt_2)_2$ as precursor and a reaction temperature of 280° C.

FIGS. 11A-11D show Mn-replacement yield (RPY) and growth yield (GY) of Mn-doped CdS/ZnS nanocrystals during ZnS shell growth. FIG. 11A shows a schematic representation of Mn-replacement; FIG. 11B shows a plot of Mn-replacement yield and growth yield as a function of temperature; FIG. 11C shows photoluminescence excitation spectra and photoluminescence spectra of Mn-doped CdS/ZnS nanocrystals with different doping levels, which were prepared at $T_x$ temperature=280° C.; and FIG. 11D shows photoluminescence excitation spectra and photoluminescence spectra of Mn-doped CdS/ZnS nanocrystals with different doping levels, which were prepared at $T_x$ temperature=240° C.

FIG. 12A shows a scheme of a CdS/ZnS nanocrystal with Mn dopants on the surface (left) and with Mn dopants embedded in a ZnS shell (right); and FIGS. 12B and 12C show plots of Mn-doping GY as a function of the Zn/Mn ratio and the S/Mn ratio, respectively, for Mn-doped CdS/ZnS nanocrystals when Mn dopants are on the surface of nanocrystals (top line) and when Mn dopants are embedded in ZnS shell (bottom line).

DETAILED DISCLOSURE

The present invention provides nanocrystals having position-controlled dopants and methods for producing same. In one embodiment, the present invention provides a method for controlling the position of dopants in nanocrystals. The ability to precisely control dopant positions inside nanocrystals, such as semiconductor nanocrystals, allows the precise control of the optical, electronic, and magnetic properties of the doped nanocrystals. Furthermore, the ability to precisely control the doping of nanocrystals facilitates the production of functional materials with new properties, which are of importance to applications including, but not limited to, biomedical diagnosis, solar cells, and spintronics.

Figure 1A:
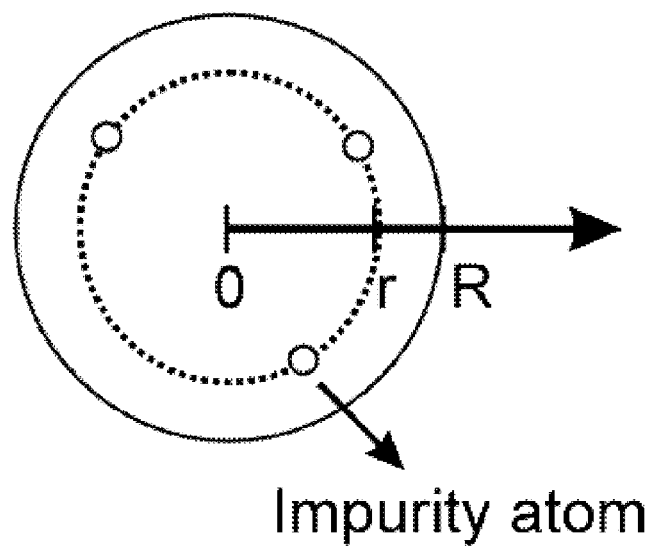
FIGS. 1a and 1b show a graphic representation of a nanocrystal containing radial-position-controlled dopants.
Figure 1B:
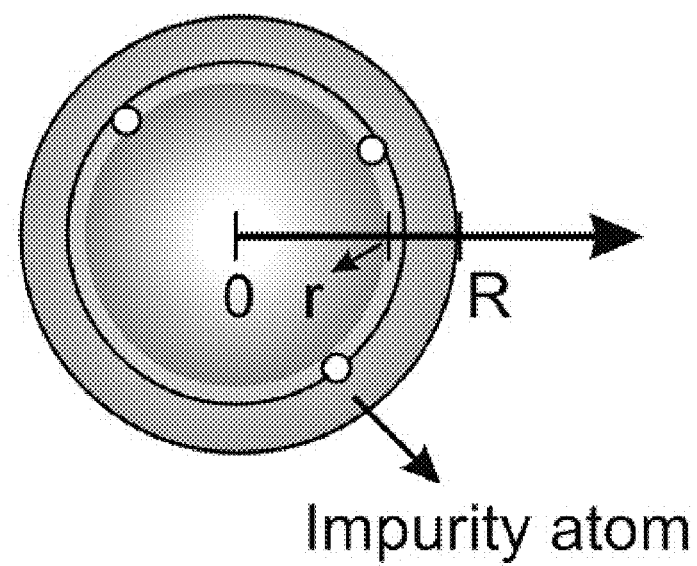

In one embodiment of the subject invention, there is provided a nanocrystal that comprises a base structure material; a plurality of dopant atoms radially positioned either within the base structure material, at the surface of the base structure material, and/or a distance from the surface of the base structure material; and a shell material surrounding the base structure material and plurality of dopant atoms, whereby the plurality of dopant atoms are embedded within the nanocrystal. In one embodiment, as illustrated in FIG. 1a, the shell material can be the same material as the base structure material for a nanocrystal having a homogeneous structure. In another embodiment, as illustrated in FIG. 1b, the base structure material can be a core material for a nanocrystal having a core/shell structure. The host materials for the base and shell structures of either above described embodiments can be selected from, for example, semiconductor materials such as CdS, CdSe, CdTe, ZnS, ZnSe, ZnTe, HgS, HgSe, HgTe, PbS, PbSe, PbTe, InP, InAs, GaP, and GaAs; metal oxides such as ZnO, $SiO_2$, $TiO_2$, $ZrO_2$, $Fe_2O_3$, $Fe_3O_4$, $SnO_2$, and $In_2O_3$; rare earth oxides such as $Gd_2O_3$, $Ce_2O_3$, and $Tb_2O_3$; or metals such as Au, Ag, Cu, Pt, Fe, and $Pt_xFe_y$. This listing is intended to be illustrative and not exhaustive.

In another aspect of the present invention, there is provided a method for forming a nanocrystal having position-controlled dopants, the method comprising synthesis of starting host particles; dopant growth; and host shell growth.

Because the intensity of exciton wave functions and crystallinity of materials depend on the radial positions in a spherical nanocrystal, the ability to control the radial position of dopants is important in synthesizing impurity-doped nanocrystals with homogeneous optical, electronic and magnetic properties. In addition, the ability to control dopant positions and doping levels in a nanocrystal provides an opportunity to systematically study nanocrystal properties as a function of these two parameters (dopant position and doping level), which is of fundamental interest to functional nano-material design.

Advantageously, the methods of the subject invention can be used to create impurity-doping-based nanocrystal materials with new optical and magnetic properties, which are important to applications such as solar cells, light-emitting devices (LED), and spintronics.

The nanocrystals of the present invention can have a variety of advantages. In one embodiment, a three-step synthesis is used to produce high-quality Mn-doped CdS/ZnS core/shell nanocrystals. This approach allows the precise control of Mn radial position and doping level in core/shell nanocrystals. This precision facilitates control of the optical properties of Mn-doped nanocrystals because the optical properties can depend on Mn radial positions inside the nanocrystal. In addition, nanocrystals produced according to the subject invention have shown a RT Mn-emission QY of 56%, which is nearly twice as high as that of the best Mn-doped nanocrystals reported previously.[24, 29, 45, 47, 50, 58, 59, 60, 61, 62] Such a high QY is very important to applications such as nanocrystal-based biomedical sensing.[11,12]

In addition, high quality II-VI semiconductor nanocrystals can be made without precursor injection.

Furthermore, the three-step synthesis approach of the present invention can be used for position-controlled doping in other nanocrystals, including, for example, Mn-doping of CdTe nanocrystals and Cl-doping of CdSe nanocrystals. In addition, Cd-free nanocrystals doped with other impurities such as $Eu^{2+}$, producing nanocrystals with a high-emission QY at different colors, may be synthesized Reference will now be made in detail to the embodiments of the present invention, certain examples of which are illustrated in the accompanying drawings. Wherever possible, the same reference numbers will be used throughout the drawings to refer to the same or like parts.

Figure 2:
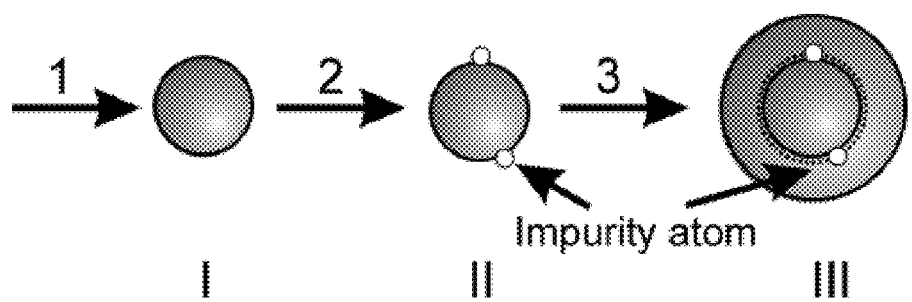
FIG. 2 shows a scheme of a three-step synthesis for doping colloidal semiconductor nanocrystals according to an embodiment of the present invention.

FIG. 2 shows a graphic representation of a nanocrystal with radial-position-controlled dopants. A method is provided to control the position, e.g. radial position, of impurity atoms in a nanocrystal. The preferred approach to the radial-position-controlled doping of nanocrystals is based on a three-step colloidal synthesis: (I) synthesis of "starting host particles," (II) dopant growth, and (III) host-shell growth. A representation of this three-step approach for a nanocrystal having a core/shell structure can be seen in FIGS. 3a-3c, the steps being labeled as I, II, and III. In one embodiment, the same materials can be used to grow both the core and the shell, i.e. for a homogeneous structure.

The architecture of a doped nanocrystal can be controlled by these three steps. In the first step, the radial position of impurity atoms in a nanocrystal can be controlled by the size of the starting core particles, and the use of different-sized starting core particles will lead to different impurity positions in a final doped nanocrystal. The starting-host particles can be spherical, pure semiconductor nanocrystals or core/shell nanocrystals.

In the second step, the doping levels can be determined. The following parameters can be used to control the doping level: (1) the amount of impurity-doping precursors, (2) the reactivity of the impurity-doping precursors, (3) the molar ratio of the impurity-doping and host precursor, (4) the reaction temperature, (5) the reaction time, and (6) the solvents. For dopant growth, a mixture of impurity-doping and host precursors can be used. A host precursor is a precursor used to grow host shells. According to a preferred embodiment, high-reactivity compounds are used as the impurity precursors, and mild-reactivity compounds are used as the host precursors. The high-reactivity compounds for the impurity precursors can be used to minimize the effects of Ostwald ripening of starting-host particles and nucleation of new particles. Reaction temperature and precursor concentrations can also be selected to further minimize the adverse affects of Ostwald ripening and nucleation of new particles. The reaction temperature can be, for example, in the range from about 20° C. to about 350° C. In an embodiment, the reaction temperature is not more than 300° C. Example 2, below, provides an illustrative embodiment for the minimization of the Ostwald ripening of starting host particles and nucleation of new particles.

In the third step, the final shell growth can determine the size of a final doped nanocrystal. This third step can also change the relative position of the impurity atom in the final particles.

Accordingly, the diameter of the starting host particles and the thickness of host shells can be used to determine the radial positions of the dopants inside the host core/shell nanocrystals.

During host-shell growth of the third step, Ostwald ripening and nucleation of new particles may also occur and growth conditions can be optimized to minimize such occurrences. Moreover, two additional effects could occur during the shell growth: (a) replacement of dopant atoms by host atoms and (b) dopant diffusion from the doped shell. To minimize these two effects, reactivity, concentration of the host precursors, and the reaction temperature can be optimized. A faster shell growth at a low temperature may inhibit these two effects. A faster kinetics in the host shell growth is expected to minimize the replacement of dopant atoms, while a lower temperature is expected to inhibit diffusion of dopant atoms. Accordingly, a high-reactivity precursor, high precursor concentration, and low growth temperature can be selected for final shell growth. Precursor concentration may be selected to be between 0.1 μmol and 10 mmol depending on the host material for the shell growth. A high precursor concentration can be, for example, between about 20 μmol and 10 mmol. Conversely, a low precursor concentration can be, for example, between about 0.1 μmol and 20 μmol.

Figures 10A, 10B:
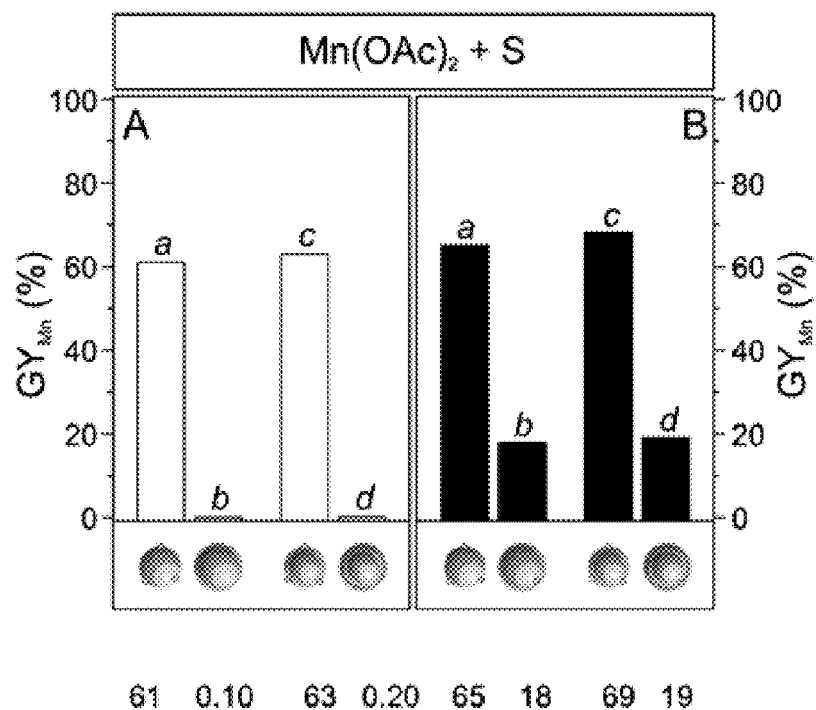
FIGS. 10A-10D show plots of Mn-doping levels of nanocrystals at different stages.
Figures 10C, 10D:
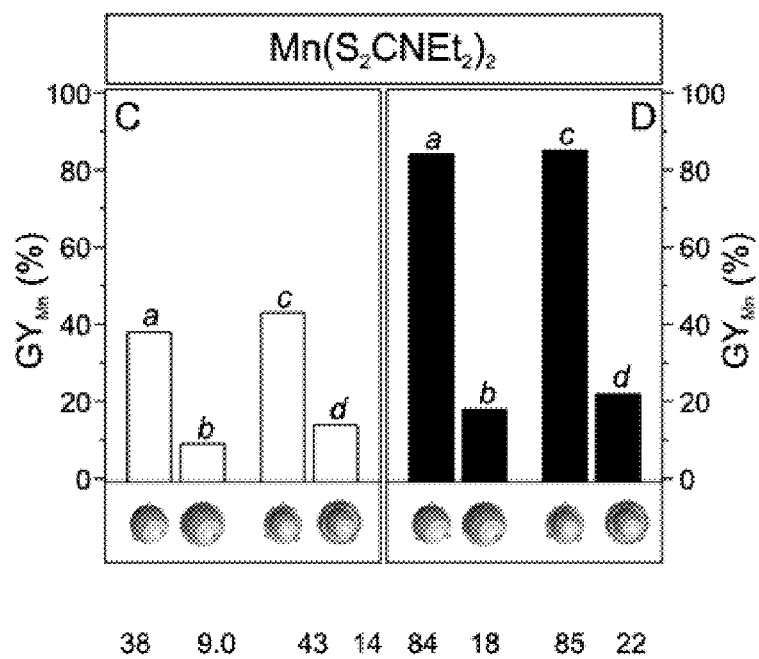

FIGS. 10A-10D show plots of Mn-doping levels of nanocrystals at different stages during ZnS shell growth of an Mn-doped CdS/ZnS core/shell nanocrystal according to embodiments of the present invention. The Mn-doping levels shown in the plots are determined by using inductively coupled plasma (ICP) atomic emission. In FIGS. 10A and 10B, shell growth is performed using a less-active precursor, Mn(OAc)$_2$, and S, and a reaction temperature of 220° C. and 280° C., respectively. In FIGS. 10C and 10D, shell growth is performed using a high-activity precursor, Mn(S$_2$CNEt$_2$)$_2$, and a reaction temperature of 220° C. and 280° C., respectively. According to these plots, it can be seen that Mn atoms can be replaced by Zn atoms during ZnS shell growth.

FIGS. 11A-11D show plots of Mn-replacement yield (RPY) and growth yield (GY) of Mn-doped CdS/ZnS nanocrystals during ZnS shell growth according to embodiments of the present invention. As illustrated in FIG. 11A, Mn-replacement of Mn-doped CdS/ZnS nanocrystals during ZnS shell growth can occur based on the reaction temperature. FIG. 11B shows a plot of Mn-replacement yield and growth yield as a function of temperature; FIG. 11C shows photoluminescence excitation spectra and photoluminescence spectra of Mn-doped CdS/ZnS nanocrystals with different doping levels, which were prepared at $T_x$ temperature=280° C.; and FIG. 11D shows photoluminescence excitation spectra and photoluminescence spectra of Mn-doped CdS/ZnS nanocrystals with different doping levels, which were prepared at $T_x$ temperature=240° C.

Figures 12A, 12B, 12C:
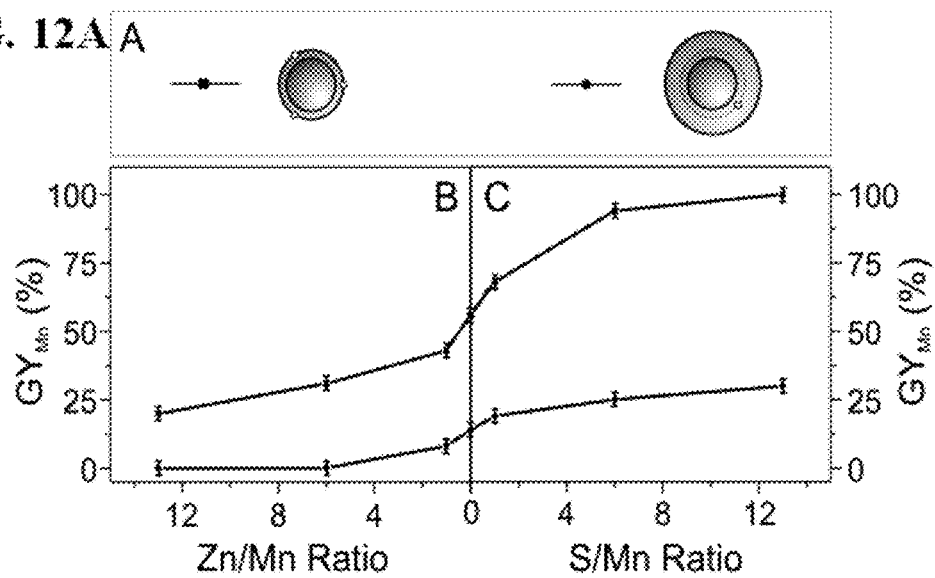
FIGS. 12A-12C show Mn-doping growth yield (GY) for Mn-doped CdS/ZnS nanocrystals.

FIGS. 12A-12C show Mn-doping growth yield (GY) for Mn-doped CdS/ZnS nanocrystals. FIG. 12A shows a scheme of a CdS/ZnS nanocrystal with Mn dopants on the surface (left) and with Mn dopants embedded in a ZnS shell (right); and FIGS. 12B and 12C show plots of Mn-doping GY as a function of the Zn/Mn ratio and the S/Mn ratio, respectively, for Mn-doped CdS/ZnS nanocrystals when Mn dopants are on the surface of nanocrystals (top line) and when Mn dopants are embedded in ZnS shell (bottom line).

Furthermore, no measurable changes in doping levels were found in the Mn-doped CdS/ZnS core/shell nanocrystals at an annealing temperature of 280° C. for 5 hours. However, at a higher temperature (e.g., 360° C.), thermal annealing would affect the Mn positions inside the doped nanocrystals.[60] Therefore, preferably, growing the host shell is performed at a growth temperature of not higher than about 350° C.

Accordingly, no detectable effects of host atoms replacing dopant atoms, nor dopant diffusion from the doped shell in Mn doping of CdS/ZnS core/shell nanocrystals according to embodiments of the subject invention was found.

Many types of doped nanocrystals can be synthesized according to the subject invention. For example, magnetic-impurity doped, conventional-impurity doped, and magnetic and conventional impurity co-doped nanocrystals can be synthesized.

In addition to the Mn doping described in the below examples, indium-doped CdS/ZnS core/shell nanocrystals can be synthesized. Indium is a conventional impurity, which is an electron donor for the CdS and ZnS semiconductors. FIG. 5 illustrates optical spectroscopy, inductively coupled plasma atomic emission spectroscopy (ICP), and TEM characterizations of an embodiment of the present invention providing indium-doped CdS/ZnS nanocrystals. Referring to FIG. 5, the indium-doped core/shell nanocrystals have a nearly identical size to those un-doped (or natural) nanocrystals. The absorption spectra show that indium-doping substantially decreases the strength of electronic transitions to the 1S$_e$ state of the CdS core. This result might indicate the n-doping of the nanocrystals. FIG. 5b shows that CdS/ZnS core/shell nanocrystals with indium dopants in the shell can be synthesized with size distribution σ of 8%.

In yet other embodiments, for example, phosphorus-doped CdS/ZnS nanocrystals, Cd-doped InAs nanocrystals, and Se-doped InAs nanocrystals can be synthesized. The choices of conventional impurities and some of their precursors are listed in Table 1. In Table 1, D is for donor and A is for acceptor.

TABLE 1

| Choice of dopants and their precursors | |
| --- | --- |
| II-VI (D) | In (trimethyl indium); Cl (CdCl$_2$, or ZnCl$_2$); and Br (CdBr$_2$, or ZnBr$_2$) |
| II-VI (A) | P (tris(tri-methylsilyl) phosphide), Na (sodium stearate); and Li (lithium stearate). |
| III-V (D) | S (S$_8$); Se (Se-tributylphosphine); Te (Te-tributylphosphine); Sn (tin acetate, or tin acetylacetonate) |
| III-V (A) | Cd (dimethyl cadmium); and Zn (dimethyl zinc) |

Accordingly, the choices of the host precursors for CdS/ZnS doping can be dimethyl cadmium or cadmium myristate (for Cd), dimethyl zinc or zinc stearate (for Zn), and elemental sulphur (for S). The choices of the host precursors for InAs doping can be trimethyl indium or indium acetate (for In), and tris(tri-methylsilyl) arsenide (for As).[9] In addition, according to certain embodiments of the present invention, the choices of solvents are (a) octadecene with varying amounts of octadeylamine[69] and (b) trioctylphosphine.[9] In other embodiments, oleyamine, or oleic acid can be used as solvents. The three-step synthesis for doping these nanocrystals can be further optimized according to the different chemical natures of dopants and host particles.

Other dopant atoms that can be used according to the subject invention, include, but are not limited to, Ag, Au, Cu, Cr, Co, Fe, Ni, Tb, Gd, Er, Ce, Nd, Dy, Pm, and Eu.

Furthermore, nanocrystals can be synthesized with dopants at two or more radial positions. The dopants can be of the same type, or of different types for use in optical and magnetic applications. Recent reports have shown that p-doped DMS, such as GaP:Mn thin film[67] and InAs:Mn self organized quantum dots[68] can exhibit ferromagnetic behavior with Tc values near or above room temperature. Accordingly, in an aspect of the present invention, co-doped nanocrystals, including GaP—(Mn:Zn), GaP—(Mn:S), InAs—(Mn:Cd), and InAs—(Mn:Se) can be used to provide ferromagnetic or superparamagnetic free-standing colloidal nanocrystals. According to certain embodiments, the choices of host precursor for GaP can be gallium acetate or trimethyl gallium (for Ga), and tris(tri-methylsilyl) phosphide (for P).

The GaP—(Mn:S) and InAs—(Mn:Se) nanocrystals can be formed following the basic three step approach with the addition of a second or more doping step. When synthesizing the GaP—(Mn:Zn) and InAs—(Mn:Cd) nanocrystals, it may be difficult to incorporate many cations (i.e., Mn and Cd) with valences that differ from the host cations (i.e., Ga and In). If such a difficulty occurs, additional co-dopants can be included to increase the solubility of Mn and Zn in GaP nanocrystals and Mn and Cd in InAs nanocrystals. In one embodiment, the choices of the additional co-dopant are S for GaP and Se for InAs. These additional co-dopants act as donors for GaP and InAs. The amount to add of these additional co-dopants should be less than the amount of the acceptors.

Specifically exemplified herein is a method for colloidal synthesis of high-quality CdS/ZnS core/shell nanocrystals with radial-position-controlled Mn dopants.

The following are example embodiments for forming three types of CdS/ZnS core/shell nanocrystals with Mn dopant at different positions: inside the CdS core (shown at IIIa of FIG. 3), at the core/shell interface (shown at IIIb of FIG. 3), and in the ZnS shell (shown at IIIc of FIG. 3).

Following are examples that illustrate procedures for practicing the invention. These examples should not be construed as limiting. All percentages are by weight and all solvent mixture proportions are by volume unless otherwise noted.

Example 1

Synthesis of the Core/Shell

The three-step synthesis of Mn-doped core/shell nanocrystals begins with the synthesis of starting host particles. Ia and Ib of FIG. 3 show starting host particles of CdS nanocrystals, while Ic of FIG. 3 shows starting host particles of CdS/ZnS core/shell nanocrystals. The starting host particles of CdS/ZnS core/shell nanocrystals can have a thin ZnS shell.

The synthesis of CdS nanocrystals can be a modification of a literature method.[6] In a particular example, cadmium myristate (0.1 mmol) and S (0.05 mmol) were loaded into a three-neck flask with 1-octadecene (ODE, 5 g). In embodiments, the cadmium myristate can be made according to the literature method[54]. After degassing under vacuum (~20 mTorr) for 10 min, the vacuum was removed. Then, under argon flow, the temperature was raised to 240° C. The growth was monitored by taking the absorption spectra of aliquots extracted from the reaction solution. When reaching the desired size, the reaction mixture was allowed to cool to room temperature, and the nanocrystals were precipitated by adding acetone. The as-prepared CdS crystals have a zinc-blende crystal structure.

The synthesis of CdS/ZnS core/shell nanocrystals can be a modification of the literature methods.[9,55] In a particular example, CdS nanocrystals (3.8 nm for FIG. 3c and 3.1 nm for FIG. 4) were dissolved in a mixture solution of ODE and oleylamine (3.6 mL of ODE and 1.2 mL of oleylamine). Then, under argon flow, the nanocrystal solution was heated to 220° C. Subsequently, zinc-stearate solution (0.04M in ODE) and S solution (0.04M in ODE) were alternatively introduced by dropwise addition. The amount of the precursor solution of shell materials was calculated according to the literature methods.[9,55] The reaction was stopped when the demanded shell thickness (~1.6 monolayers) was reached, and the nanocrystals were precipitated by adding acetone. The nanocrystals were re-dispersed in hexane as a high-concentration solution.

Example 2

Dopant Growth

Once the starting particles are synthesized, the three-step synthesis of Mn-doped core/shell nanocrystals continues with Mn-dopant growth. In this second step, Mn-doping can be achieved by the growth of partial MnS shells onto the starting host particles. Mn-doping levels (i.e., concentration of the dopants) of the nanocrystals can be controlled in this step in direct proportion to the amount of MnS-growth precursors added (e.g., $Mn(Ac)_2$ and S).

In one example, for Mn-dopant growth using the active precursor $Mn(S_2CNEt_2)_2$, a hexane solution of starting host particles (CdS or CdS/ZnS) was added into a mixture solution of ODE and oleylamine (3.6 mL of ODE and 1.2 mL of oleylamine), and then hexane was removed under vacuum. Under argon flow, the nanocrystal solution was heated to 220° C., and then an oleylamine solution of the active Mn precursor $(Mn(S_2CNEt_2)_2)$ (0.005 M) was introduced into the hot solution by dropwise addition. After a further 20-min reaction, the synthesis was stopped by quenching the reaction system to room temperature, and the nanocrystals were precipitated by adding acetone. The nanocrystals were re-dispersed in hexane as a high-concentration solution.

In one embodiment, the $Mn(S_2CNEt_2)_2$ used for dopant growth can be synthesized by a modification of a literature method.[56] In a particular example, under argon flow, 0.002 mmol of $MnAc_2$ and 0.044 mmol of $NaS_2CNEt_2$ were dissolved into 2 ml of oleylamine, respectively. Then the $NaS_2CNEt_2$ solution was added into the $MnAc_2$ solution at 60° C. with stirring under argon flow. After 10 min, a slightly yellow solution of $Mn(S_2CNEt_2)_2$ was used directly for dopant growth.

In another example for Mn-dopant growth using the less-active precursors $Mn(Ac)_2$ and S, a hexane solution of starting host particles (CdS or CdS/ZnS) was added into a mixture solution of ODE and oleylamine (3.6 ml, of ODE and 1.2 mL of oleylamine), and then hexane was removed under vacuum.

Under argon flow, the nanocrystal solution was heated to 280° C., and then Mn(Ac)$_2$ solution (0.005 M in oleylamine) and S solution (0.01 M in ODE) were alternatively introduced into the hot solution by dropwise addition. After a further 20-min reaction, the synthesis was stopped, and nanocrystals were precipitated by adding acetone. The nanocrystals were re-dispersed in hexane as a high-concentration solution.

FIG. 6 shows the relationship of precursor type and absorption spectrum. Referring to FIG. 6, the absorption spectrum of Mn-doped CdS nanocrystals made by the less-active precursors does not exhibit sharp exciton-absorption features as compared with the spectrum made by using the active precursors. This result indicates that ripening of CdS nanocrystals is much more pronounced in the former case at higher temperature than in the latter case at lower temperature. As shown in these examples, the high-temperature reaction is critical for the dopant growth using the less-active precursors.

One issue in the second step lies in Ostwald ripening of the nanocrystals, which can lead to a broadening of their size distributions. When the starting host particles are pure CdS (i.e., Ia and Ib in FIG. 3), the Mn-dopant growth led to significant ripening of nanocrystals at high temperatures (e.g., 280° C.), and the size distribution of nanocrystals quickly broadened. To minimize Ostwald ripening of the nanocrystals, an active single molecular precursor (i.e., Mn(S$_2$CNEt$_2$)$_2$) can be used for low-temperature dopant growth (e.g., 220° C.). In contrast to CdS nanocrystals, when the starting host particles are CdS/ZnS core/shell particles (Ic in FIG. 3), no substantial ripening occurred during Mn-dopant growth, even at 280° C. This chemical nature allows the use of less-active precursors (i.e., Mn(Ac)$_2$ and S) for Mn-dopant growth on these core-shell nanocrystals. These less-active precursors are exchangeable with the active precursor during the dopant growth on CdS/ZnS core/shell nanocrystals at 280° C.

Example 3

Growing the Host Shell

Finally, the three-step synthesis can be completed by growing the host-shell.

Referring to IIIa of FIG. 3, for Mn dopant inside the CdS core of CdS/ZnS core/shell nanocrystals, a hexane solution of Mn-doped CdS nanocrystals was added into a mixture solution of ODE and oleylamine (3.6 mL of ODE and 1.2 mL of oleylamine), and then hexane was removed by vacuum. Under argon flow, the nanocrystal solution was heated to 240° C., and cadmium myristate solution (0.04M in ODE) and S solution (0.04 M in ODE) were alternatively introduced by dropwise addition. The shell growth was monitored by using UV-Vis spectroscopy. After two monolayers (increasing the diameter to 3.8 nm from 2.4 nm), the reaction solution was cooled down to 220° C. Then zinc-stearate solution (0.04M in ODE) and sulfur solution (0.04M in ODE) were alternatively introduced into the hot solution by dropwise addition. When ZnS-shell thickness reached about 1.6 monolayers, the reaction solution was heated to 280° C. for further ZnS shell growth. After the desired shell thickness was achieved, a zinc-stearate solution (0.12 mmol, 0.04M in ODE) was added to the reaction system. Then the synthesis was stopped by cooling the reaction solution to room temperature, and the nanocrystals were precipitated by adding acetone. In an embodiment, the nanocrystals can be re-dispersed into non-polar organic solvents.

Referring to IIIb of FIG. 3, for Mn dopant at the interface of CdS/ZnS nanocrystals, a hexane solution of Mn-doped CdS nanocrystals was added into a mixture solution of ODE and oleylamine (3.6 mL of ODE and 1.2 mL of oleylamine), and then hexane was removed under vacuum. Under argon flow, the nanocrystal solution was heated to 220° C. Then zinc-stearate solution (0.04M in ODE) and sulfur solution (0.04M in ODE) were alternatively introduced into the hot solution by dropwise addition. When ZnS-shell thickness reached about 1.6 monolayers, the reaction solution was heated to 280° C. for further ZnS shell growth. After the desired shell thickness was achieved, a zinc-stearate solution (0.12 mmol, 0.04M in ODE) was added to the reaction system. Then the synthesis was stopped by cooling the reaction solution to room temperature, and the nanocrystals were precipitated by adding acetone. In an embodiment, the resulting nanocrystals can be redispersed into non-polar organic solvents.

Referring to IIIc of FIG. 3, for Mn dopant in the ZnS shell of CdS/ZnS core/shell nanocrystals, a hexane solution of Mn-doped CdS/ZnS nanocrystals was dissolved in a mixture solution of ODE and oleylamine (3.6 mL of ODE and 1.2 mL of oleylamine), and then hexane was removed under vacuum. Under argon flow, the nanocrystal solution was heated to 280° C. Zinc-stearate solution (0.04M in ODE) and sulfur solution (0.04M in ODE) were alternatively introduced into the hot solution by dropwise addition. After the desired shell thickness was achieved, a zinc-stearate solution (0.12 mmol, 0.04M in ODE) was added to the reaction system. Then the synthesis was stopped by cooling the reaction solution to room temperature, and the nanocrystals were precipitated by adding acetone. In an embodiment, the nanocrystals can be re-dispersed into non-polar organic solvents.

According to these three examples, the final core/shell particles (i.e., IIIa, IIIb, and IIIc) have CdS core diameter of 3.8 nm (with a standard deviation σ of ~8%) and ZnS shell thickness of 1.5 nm (σ~8%).

Example 4

Analysis of Nanocrystals Produced According to the Subject Invention

Elemental analysis of as-prepared nanocrystals using inductively coupled plasma atomic emission spectroscopy (ICP) shows that only around 30% of the Mn in the precursors can grow onto the starting host particles. To achieve a more precise control of the Mn position inside the nanocrystals, a separation can be carried out to remove the un-reacted Mn-species from the growth solution before host-shell growth in the third step.

The nanocrystal properties introduced by position-controlled impurities can be identified by using structural, optical, and magnetic characterization techniques. In addition, it can be demonstrated that the room-temperature (RT) photoluminescence (PL) quantum yield (QY) of Mn dopants strongly depends on their radial positions inside the host core/shell nanocrystals.

In particular, photoluminescence (PL) and photoluminescence excitation (PLE) experiments were performed using a spectrofluorimeter (Fluorolog-3, Horiba Jobin Yvon, Irvine, Calif.). Room-temperature fluorescence quantum yields (QY) of the Mn-doped nanocrystals were determined by using literature methods.[9,57] Quinine sulfate in 0.5M of H$_2$SO$_4$ was used as the fluorescence standard.[57]

Figures 3A, 3B, 3C, 3D, 3E, 3F, 3G:
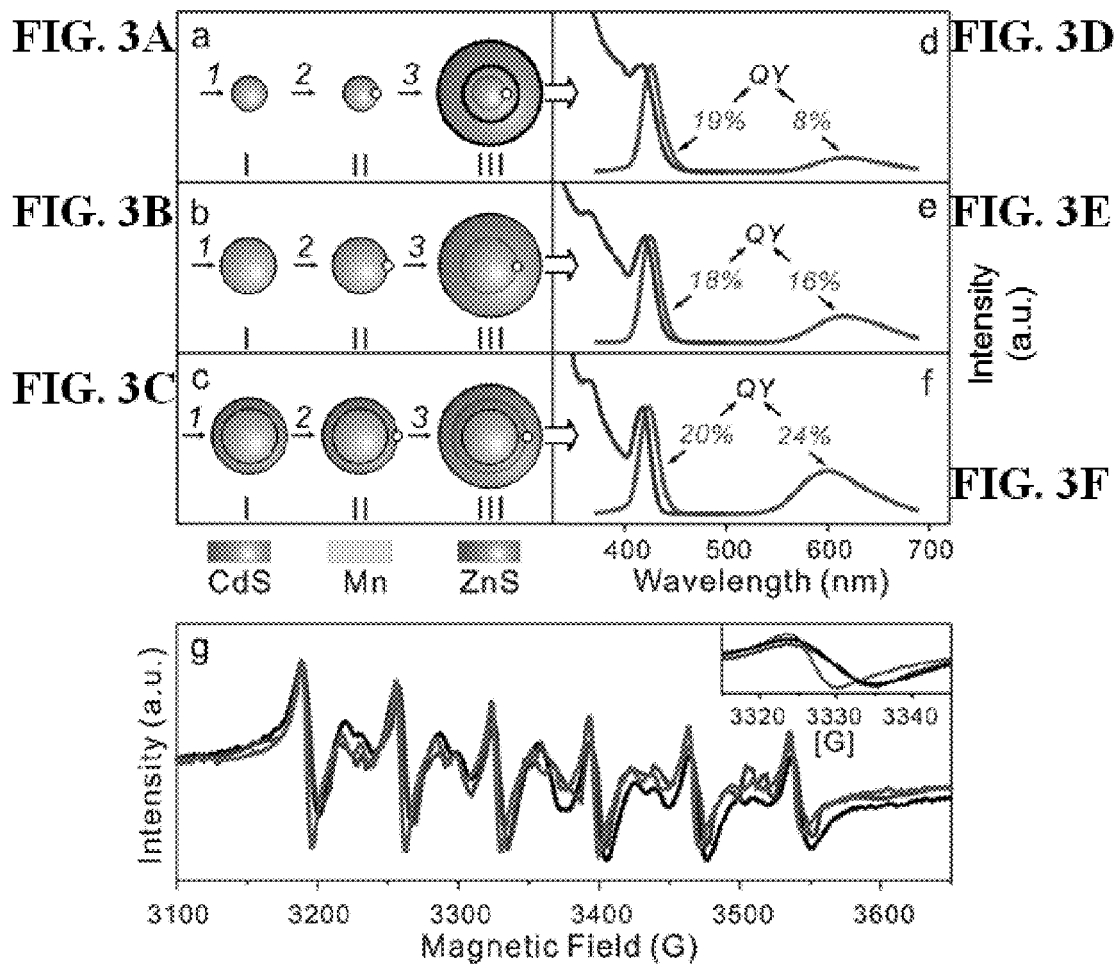
FIGS. 3a-3g show a scheme of Mn-doped CdS/ZnS core/shell nanocrystals with different Mn positions and their corresponding PL and EPR spectra according to embodiments of the subject invention.

Referring to FIG. 3, the data from transmission electron microscope (TEM) and IPC show that these three types of Mn-doped core/shell nanocrystals have a nearly identical CdS-core size, ZnS-shell thickness, and Mn-doping level (0.10%, ~4 Mn atoms per particle). These Mn-doped nanocrystals exhibit two PL bands: the blue band is assigned to the emission from exciton recombination in the core/shell nanocrystals, and the red band is assigned to the emission from Mn dopants ($^4T_1$ to $^6A_1$, FIGS. 3d-3f).[50,58] The PL excitation spectra of these CdS/ZnS nanocrystals indicate that energy transition from the exciton in the nanocrystals to the Mn dopants gives rise to the red emission.[50] In addition, these nanocrystals exhibit a nearly identical absorption peak position for their first exciton band. This result is consistent with TEM measurements that the CdS core size is nearly identical for these Mn-doped core/shell nanocrystals.

Importantly, these Mn-doped nanocrystals exhibit dopant-position-dependent optical properties (FIGS. 3d, 3e and 3f). The QY of the blue-exciton emission is similar for these nanocrystals, but the QY of the Mn emission is substantially different for the nanocrystals with Mn dopants inside a CdS core (8%), at the core/shell interface (16%), and in the ZnS shell (24%). These results indicate that the non-radiative decay of the Mn excited state ($^4T_1$)—not the overlapping between the Mn and excitonic wave-functions (i.e., energy transfer from the exciton to the Mn)—plays the dominant role in controlling the Mn-emission QY. Therefore, the position-dependent Mn-emission QY would be caused by the following two factors: (1) the Mn—Mn interactions inside a doped core/shell nanocrystal, and (2) the local crystal-field strain on the Mn dopants.

The Mn positions inside the core/shell nanocrystals were identified using electron paramagnetic resonance (EPR) spectroscopy. The EPR measurement was performed in CW mode on an X-band Bruker Elexsys 580 spectrometer (9.5 GHz and 6K). The samples were treated by pyridine exchange twice according to literature methods.[29,48] The purified nanocrystals were dissolved in a toluene solution with 10% polystyrene to form a glass upon freezing.

Referring to FIG. 3g, these three types of core/shell nanocrystals exhibit a six-line spectrum with a similar hyperfine splitting constant of about 69.4 G. Such a hyperfine splitting constant indicates that the Mn dopants are at cubic CdS or ZnS lattice sites, and thus the dopants are indeed located inside the core/shell nanocrystals.[63] This result is consistent with X-ray powder diffraction (XRD) measurements shown in FIG. 7 that these core/shell nanocrystals have a zincblende (i.e., cubic) crystal structure.

Referring to FIG. 7, Powder X-ray diffraction patterns were measured on a Philips PW 3720 X-ray diffractometer with Cu Kα radiation. Approximately 10 mg of nanocrystals were dispersed in 0.5 mL of toluene. The nanocrystal solution was deposited onto low-scattering quartz plates, and the solvent was evaporated under mild vacuum. Accordingly, both CdS core and Mn-doped CdS/ZnS core/shell nanocrystals exhibit a zinc-blende crystal structure. With ZnS growth, the diffraction peaks shift to larger angles consistent with the smaller lattice constant for ZnS, compared with CdS crystals. In addition, the diffraction peaks narrowed. This narrowing indicates that the crystalline domain is larger for the core/shells, providing direct evidence for an epitaxial growth mode of the shell.

In addition, referring back to FIG. 3g, the line-width of the EPR peaks is different for the nanocrystals with Mn dopants in the CdS core (12 G), at the core/shell interface (12 G), and in the ZnS shell (7.4 G, inset of FIG. 3g). The narrower EPR-peak line-width indicates weaker Mn—Mn interactions and less local strain on the Mn dopants in the ZnS shell.[64] Both effects can lead to less non-radiative decay of the Mn excited state, and therefore, a higher Mn-emission QY for the core/shell particles with Mn in the shell. It is consistent with the results from optical measurements (FIGS. 3d-3f). Taken together, the results from both optical and EPR measurements suggest that radial-position-controlled Mn-doping of CdS/ZnS nanocrystals is achieved by the three-step synthesis.

Mn-doping levels of the doped nanocrystals were determined by using inductively coupled plasma atomic emission spectroscopy (ICP) with controlled chemical etching of nanocrystals. Recent progress in the chemical etching of nanocrystals allows the controlled reduction of particle size by peeling off a nanocrystal's surface atoms without substantial changes in particle size distribution.[53] In the embodiment examples, the nanocrystal samples were treated by pyridine exchange twice according to literature methods.[29,48] The purified nanocrystals were digested by concentrated $HNO_3$, and organic remainder was removed from the digested solution by filtration. Then the solution was diluted by a $HNO_3$ solution with a final $HNO_3$ concentration of about 1-2%. The TCP measurements were carried out using a Vista RL CCD Simultaneous ICP-AES (Varian, Inc.). Mn-doping levels were calculated by the following formula:

$$\text{Doping\_Level} = \frac{[\text{Mn}]}{[\text{Cd}] + [\text{Zn}] + [\text{Mn}]}.$$

FIG. 8 shows the steps for identification of doping level and radial position of impurities of the experiments. The doped nanocrystals can be sequentially etched to a series of small particles, according to the literature method.[53] Therefore, the doping level of these small particles (B, C, and D in FIG. 8) and the original nanocrystals (A in FIG. 8) can be measured. Then, the position distribution of impurities in the doped nanocrystals can be obtained by analyzing the doping levels in these nanocrystals.

Referring to FIG. 4, the core/shell nanocrystals were synthesized according to the examples with Mn dopant in the ZnS shell of CdS/ZnS core/shell nanocrystals. FIG. 4a shows a normalized PL spectra of Mn-doped CdS/ZnS core/shell nanocrystals with different doping levels. These core/shell nanocrystals have a CdS core diameter of 3.1 nm (σ~6%), ZnS-shell thickness is 1.5 nm (~4.8 monolayers), and the Mn dopants are located at 1.6 monolayers in the shell.

Example 5

Systematic Study of Effects of Mn-Doping Level

The three-step synthesis allows a systematic study of the effects of Mn-doping level of CdS/ZnS core/shell nanocrystals (FIGS. 4a-4c). Nine types of core/shell nanocrystals were synthesized with Mn-doping levels from 0.013% to 1.8%. These nanocrystals have a 3.1-nm CdS core coated with a ZnS shell of 4.8 monolayers (ML), and Mn dopants are at 1.6 ML in the shell. The Mn-doping levels were determined by ICP measurements. Referring to FIG. 4b, the TEM image of a typical nanocrystal sample shows that the Mn-doped core/shell nanocrystals are highly monodispersed with a standard deviation of 6%. Referring to FIG. 4a, with the increase of the Mn-doping level, the QY of the Mn emission increases, while the QY of blue-exciton emission decreases. The exciton emission appears to be totally quenched when the doping level reaches 0.44%. This result further demonstrates that Mn-emission originates from the energy transfer from exciton of the core/shell particles to the Mn.[50,58] In addition, as shown in FIG. 4c, the QY of Mn emission reaches a maximum of around 44% when the doping level is 0.36%. According to FIG. 4c, a maximum QY up to 56% is achieved at δ of 3.2 ML. With a further increase of the Mn-doping level, the QY of the Mn emission decreases. This further increase in Mn-doping level could cause stronger Mn—Mn interactions and/or create greater crystal-field strain in ZnS shells. Both cases can increase non-radiative decay of the Mn excited state, and thus lead to a decreased Mn-emission QY.

To produce nanocrystals with a higher Mn-emission QY, FIG. 4d shows the effects of detailed Mn positions inside the ZnS shell of the core/shell nanocrystals. Keeping the core size and shell thickness unchanged (as those in the study of doping-level effects, FIG. 4c) a Mn-doping level of 0.36% was used for this study. Six types of nanocrystals were synthesized with Mn position (δ) varying from 0 to 4.0 ML inside the ZnS shell. As shown in FIG. 4d, the QY of the Mn emission strongly depends on the Mn position. The Mn-emission QY increases with the increase of δ. A maximum QY up to 56% is achieved at δ of 3.2 ML, and then the QY decreases with the further increase of δ. This position-dependent Mn emission could be, in part, caused by the inhomogeneity of local crystal-field strain inside the ZnS shell caused by the 7% lattice mismatch between the CdS and ZnS crystal lattice.[9,55] This result is consistent with EPR measurements shown in FIG. 4e, in which the narrower line-width of EPR peaks indicates less local-crystal-field strain on MN dopants.

According to the plots shown in FIG. 4, doped nanocrystals have a RT Mn-emission QY of 56%, which is nearly twice as high as that of the best Mn-doped nanocrystals reported previously.[29,58] Such a high QY is very important to applications such as nanocrystal-based biomedical diagnosis.[12]

All patents, patent applications, provisional applications, and publications referred to or cited herein are incorporated by reference in their entirety, including all figures, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

REFERENCES

1. Bawendi, M. G., Steigerwald, M. L., Brus, L. E., "The quantum-mechanics of larger semiconductor cluster (quantum dots)," *Ann. Rev. Phys. Chem.* 41, 477 (1990).
2. Alivisatos, A. P., "Perspectives on the physical chemistry of semiconductor nanocrystals," *J. Phys. Chem.* 100, 13226 (1996).
3. El-Sayed, M. A. "Small is different: shape-, size-, and composition-dependent properties of some colloidal semiconductor nanocrystals," *Acc. Chem. Res.* 37, 326 (2004).
4. Murray, C. B.; Norris, D. J.; Bawendi, M. G., "Synthesis and characterization of nearly monodisperse CdE (E=sulfur, selenium, tellurium) semiconductor nanocrystallites," *J. Am. Chem. Soc.* 115, 8706 (1993).
5. Peng, Z. A.; Peng, X. "Formation of high-quality CdTe, CdSe, and CdS nanocrystals using CdO as precursor," *J. Am. Chem. Soc.* 123, 183 (2001).
6. Cao, Y. C. Wang, J., "One-pot Synthesis of High-quality Zinc-Blende CdS Nanocrystals," *J. Am. Chem. Soc.* 126, 14336 (2004).
7. Du, H.; Chen, C.; Krishnan, R.; Krauss, T. D.; Harbold, J. M.; Wise, F. W.; Thomas, M. G.; Silcox, "Optical Properties of Colloidal PbSe Nanocrystals," *J. Nano Lett.* 2, 1321 (2002).
8. Hines M. A., Scholes G. D., "Colloidal PbS nanocrystals with size-tunable NIR Emission: Observation of post-synthesis self-narrowing of the particle size distribution," *Adv. Mater.* 15; 1844 (2003).
9. Cao, Y.; Banin, U., "Growth and properties of semiconductor core/shell nanocrystals with InAs cores." *J. Am. Chem. Soc.* 122, 9692 (2000);
10. Kim, Y.-H.; Jun, Y.-w.; Jun, B.-H.; Lee, S.-M.; Cheon, J., "Sterically Induced Shape and Crystalline Phase Control of GaP Nanocrystals," *J. Am. Chem. Soc.* 124; 13656 (2002).
11. Han, M.; Gao, X.; Su, J. Z.; Nie, S., "Quantum-dot-tagged microbeads for multiplexed optical coding of biomolecules," *Nat. Biotechnol.* 19, 631 (2001).
12. Alivisatos, A. P., "The use of nanocrystals in biological detection," *Nat. Biotechnol.* 22, 47 (2004).
13. Klimov, V. I.; Mikhailovsky, A. A.; Xu, Su; Malko, A.; Hollingsworth, J. A.; Leatherdale, C. A.; Eisler, H.-J.; Bawendiz, M. G. "Optical gain and stimulated emission in nanocrystal quantum dots," *Science* 290; 314 (2000).
14. Zhu, L.; Zhu, M.-Q.; Hurst, J. K.; Li, A. D. Q., "Light-Controlled Molecular Switches Modulate Nanocrystal Fluorescence," *J. Am. Chem. Soc.* 127; 8968 (2005).
15. Wang, C. J.; Shim, M.; Guyot-Sionnest, P. "Electrochromic nanocrystal quantum dots," *Science* 291, 2390 (2001).
16. Dickson, R. M.; Lyon, L. A., "Unidirectional plasmon propagation in metallic nanowires." *J. Phys. Chem. B.* 104, 6095 (2000).
17. Colvin, V. L.; Schlamp, M. C.; Allvisatos, A. P., "Light-emitting diodes made from cadmium selenide nanocrystals and a semiconducting polymer," *Nature* 370, 354 (1994).
18. Gugliotti, L. A.; Feldheim, D. L.; Eaton B. E., "RNA-mediated metal-metal bond formation in the synthesis of hexagonal palladium nanoparticles," *Science* 304, 850 (2004).
19. Klein, D. L., A. R. Roth, Lim, K. I., Alivisatos A. P., McEuen P. L., "A single-electron transistor made from a cadmium selenide nanocrystal," *Nature* 389, 699 (1997).
20. Sapoval, B. and Hermann, C. Springer-Verlag, *Physics of semiconductors: New York.* 1993.
21. Yu, P. Y. and Cardona, M., Springer "Fundamentals of semiconductors," New York, 1995.
22. *Diluted Magnetic (Semimagnetic) Semiconductors, Eds.,* Aggarwal, R. L.; Furdyna, J. K., von Molnar, S., *MRS Symposia Proceedings*, Volume 89, Pittsburgh, Pa. (1987).
23. S. Wolf, A.; Awschalom, D. D. Buhrman, R. A.; Daughton, J. M.; von Molnár, S.; Roukes, M. L, Chtchelkanova, A. Y., and Treger, D. M., "Spintronics: a spin-based electronics vision for the future," *Science* 294, 1488 (2001).
24. Shim, M., Wang, C., Norris, D. J. and Guyot-Sionnest, P. "Doping and charging in colloidal semiconductor nanocrystals," *MRS Bulletin,* 26, 1005 (2001).
25. Millo, O.; Katz, D.; Cao, Y.; Banin, U. "Imaging and spectroscopy of artificial-atom states in core/shell nanocrystal quantum dots," *Phys. Rev. Lett.* 86, 5751(2001).
26. Shim, M.; Guyot-Sionnest, P. "N-type colloidal semiconductor nanocrystals," *Nature* 407, 981 (2000).
27. Wehrenberg, B. L.; Guyot-Sionnest, P., "Electron and hole injection in PbSe quantum dot films," *J. Am. Chem. Soc.* 125, 7806 (2003).
28. Yu, D.; Wang, C. J.; Guyot-Sionnest, P. "N-type conducting CdSe nanocrystal solids," *Science* 300, 1277 (2003).
29. Norris, D. J., Yao, N., Charnock, F. T. and Kennedy, T. A., "High-quality manganese-doped ZnSe nanocrystals," *Nano Lett.* 1, 3 (2001).
30. Hoffman, D. M.; Meyer, B. K.; Ekimov, A. I.; Merkulov, I. A.; Efros Al. L.; Rosen, M.; Couino, G.; Gacoin, T., 30. Boilot, J. P., "Giant internal magnetic fields in Mn doped nanocrystal quantum dots," *Solid State Commun.* 114, 547 (2000).
31. Wang, Y., Herron, N., Moller, K. & Bein, T., "3-dimensionally confined diluted magnetic semiconductor clusters: $Zn_{1-x}Mn_xS$," *Solid State Commun.* 77, 33 (1991).
32. Bhargava, R. N., Gallagher, D., Hong, X. and Nurmikko, A., "Optical properties of manganese-doped nanocrystals of ZnS," *Phys. Rev. Lett.* 72, 416 (1994).
33. Bhargava, R. N.; Gallagher, D.; Welker, T., "Doped nanocrystals of semiconductors—a new class of luminescent materials," *J. Lumin.* 60-61, 275 (1994).
34. Sooklal, K.; Cullum, B. S.; Angel, M.; Murphy, C. J. "Photophysical properties of ZnS nanoclusters with spatially localized $Mn^{2+}$," *J. Phys. Chem.* 100, 4551 (1996).
35. Levy, L., Hochepied, J. F. & Pileni, M. P., "Control of the size and composition of three dimensionally diluted magnetic semiconductor clusters," *J. Phys. Chem.* 100, 18322 (1996).
36. Suyver, J. F., Wuister, S. F., Kelly, J. J. & Meijerink, A., "Luminescence of nanocrystalline $ZnSe:Mn^{2+}$," *Phys. Chem. Chem. Phys.* 2, 5445 (2000).
37. Stowell, C. A., Wiacek, R. J., Saunders, A. E. & Korgel, B. A., "Synthesis and characterization of dilute magnetic semiconductor manganese-doped indium arsenide nanocrystals," *Nano Lett.* 3, 1441 (2003).
38. Hanif, K. M.; Meulenberg, R. W.; Strouse, G. F., "Magnetic ordering in doped $Cd_{1-x}Co_xSe$ diluted magnetic quantum dots," *J. Am. Chem. Soc.* 124, 11495 (2002).
39. Meulenberg, R. W.; van Buuren, T.; Hanif, K. M.; Willey, T. M.; Strouse, G. F.; Terminello, L., "Structure and composition of Cu-doped CdSe nanocrystals using soft X-ray absorption spectroscopy," *J. Nano Letters* 4, 2277 (2004).
40. Raola, R. E.; Strouse, G. F., "Synthesis and characterization of Eu-doped cadmiumselenide nanocrystals." *Nano Lett.* 2, 1443 (2002).
41. Bol, A. A.; van Beek, R.; Meijerink, A., "On the incorporation of trivalent rare earth ions in II-VI semiconductor nanocrystals." *Chem. Mater.* 14, 1121 (2002).
42. Suyver, J. F.; Wuister, S. F.; Kelly, J. J.; Meijerink, A., "Luminescence of nanocrystalline $ZnSe:Mn^{2+}$," *PCCP* 2, 5445 (2000).
43. Counio, G.; Gacoin, T.; Boilot, J. P., "Synthesis and photoluminescence of $Cd_{1-x}Mn_xS$ (x≤5%) nanocrystals." *J. Phys. Chem. B* 102, 5257 (1998).
44. Kittilstved, K. R.; Gamelin, D. R., "Activation of High-TC Ferromagnetism in Mn2+-Doped ZnO using Amines," *J. Am. Chem. Soc.* 127, 5292 (2005).
45. Schwartz, D. A.; Norberg, N. S.; Nguyen, Q. P.; Parker, J. M.; Gamelin, D. R., "Magnetic Quantum Dots: Synthesis, Spectroscopy, and Magnetism of Co2+- and Ni2+-Doped ZnO Nanocrystals," *J. Am. Chem. Soc.*, 125, 13205 (2003).
46. Radovanovic, P. V.; Gamelin, D. R., "Electronic absorption spectroscopy of cobalt ions in diluted magnetic semiconductor quantum dots: demonstration of an isocrystalline core/shell synthetic method," *J. Am. Chem. Soc.* 123, 12207 (2001).
47. Somaskandan, K.; Tsoi, G. M.; Wenger, L. E.; Brock, S. L., "Isovalent doping strategy for manganese introduction into III-V diluted magnetic semiconductor nanoparticles: InP:Mn," *Chem. Mater.* 17, 1190 (2005).
48. Mikulec, F. V.; Kuno, M.; Bennati, M.; Hall, D. A. Griffin, R. G. and Bawendi, M. G., "Organometallic synthesis and spectroscopic characterization of manganese-doped CdSe nanocrystals," *J. Am. Chem. Soc.* 122, 2532 (2000).
49. Hwang, I. S., Kim, H. D., Kim, J. E., Park, H. Y. & Lim, H., "Solid solubilities of magnetic ions in diluted magnetic semiconductors grown under equilibrium conditions," *Phys. Rev B* 50, 8849 (1994).
50. Erwin, S. C.; Zu, L.; Haftel, M. I.; Efros, A. L. Kennedy. T. A.; and Norris, D. J., "Doping semiconductor nanocrystals," *Nature* 436, 91 (2005).
51. Yang, Y. A.; Wu, H.; and Cao, Y. C., "Synthesis of CdSe and CdTe Nanocrystals without Precursor Injection," *Angew. Chem. Int. Ed.* 44, 6712 (2005).
52. Cao, Y.; Banin, U. "Synthesis and characterization of InAs/InP and InAs/CdSe core/shell nanocrystals", *Angew. Chem. Int. Ed.* 38, 3692 (1999).
53. Yu, W. W.; Qu, L.; Guo, W.; Peng, X., "Experimental Determination of the Extinction Coefficient of CdTe, CdSe, and CdS Nanocrystals," *Chem. Mater.* 15, 2854 (2003).
54. Yang, Y. A.; Wu, H. M.; Williams, K. R.; Cao, Y. C. "Synthesis of CdSe and CdTe Nanocrystals without Precursor Injection" *Angew. Chem. Int. Ed.* 44, 6712 (2005).
55. Xie, R.; Kolb, U.; Basche, T.; Mews, A., "Synthesis and Characterization of Highly luminescent CdSe—Core CdS/$Zn_{0.5}Cd_{0.5}S$/ZnS Multishell Nanocrystals," *J. Am. Chem. Soc.* 127, 7480 (2005).
56. Coucouvanis, D., "The chemistry of the dithioacid and 1,1-dithiolate complexes," *Prog. Inorg. Chem.* 11, 233 (1970).
57. Demas, J. N.; Crosby, G. A., "The measurement of photoluminescence quantum yields: A review," *J. Phys. Chem.* 75, 991 (1971).
58. Pradhan, N.; Goorskey, D.; Thessing, J.; Peng, X., "An Alternative of CdSe Nanocrystal Emitters: Pure and Tunable Impurity Emissions in ZnSe Nanocrystals," *J. Am. Chem. Soc.* 127, 17586 (2005).
59. Yang, H.; Holloway, P. H., "Enhanced photoluminescence from CdS:Mn/ZnS core/shell quantum dots," *Appl. Phys. Lett.* 82, 1965 (2003).
60. Ji, T.; Jian, W.-B.; Fang, J., "The First Synthesis of Pb1-xMnxSe Nanocrystals," *J. Am. Chem. Soc.* 125, 8448 (2003).
61. Stowell, C. A.; Wiacek, R. J.; Saunders, A. E.; Korgel, B. A., "Synthesis and Characterization of Dilute Magnetic Semiconductor Manganese-Doped Indium Arsenide Nanocrystals," *Nano. Lett.* 3, 1441 (2003).
62. Raola, O. E.; Strouse, G. F., "Synthesis and Characterization of Eu-Doped Cadmium Selenide Nanocrystals" *Nano Lett.* 2, 1443 (2002).
63. Lifshitz, E., Francis, A. II., "Analysis of the ESR spectrum of manganese(II) impurity centers in the layered compound cadmium phosphide sulfide (CdPS3)" *J. Phys. Chem.* 86, 4714 (1982).
64. Kremer, R. E.; Furdyna. J. K., "Investigation of EPR in $Cd_{1-x}Mn_xTe$ by microwave Faraday effect," *Phys. Rev. B* 31, 1 (1985).
65. Colvin. V. L. "The potential environmental impact of engineered nanomaterials." *Nat. Biotechnol.* 21, 1166 (2003).
66. Dalpian, G. M.; Chelikowsky, J. R. "Self-purification in semiconductor nanocrystals-" *Phys. Rev. Lett.* 96, 226802 (2006).
67 (a) Theodoropoulou, N.; Hebard, A. F.; Overberg, M. E.; Abernathy, C. R.; Pearton, S. J.; Chu, S. N. G.; Wilson, R. G. "Unconventional carrier-mediated ferromagnetism above room temperature in ion-implanted (Ga, Mn)P:C." *Phys. Rev. Lett.*, 89, 107203 (2002); (b) Pearton, S. J.; Overberg, M. E.; Thaler, G. L.; Abernathy, C. R.; Kim, J.; Ren, F.; Theodoropoulou, N.; Hebard, A. F.; Park, Y. D.

"Room temperature ferromagnetism in GaMnN and GaMnP." *Physica Status Solidi A: Applied Research*, 195, 222 (2003).
68. Holub, M.; Chakrabarti, S.; Fathpour, S.; Bhattacharya, P.; Lei, Y.; Ghosh, S. "Mn-doped InAs self-organized diluted magnetic quantum-dot layers with Curie temperatures above 300 K." *Appl. Phys. Lett.*, 85, 973 (2004).
69. Li, J. J.; Wang, Y. A.; Guo, W.; Keay, J. C.; Mishima, T. D.; Johnson, M. B.; Peng, X. "Large-scale synthesis of nearly monodisperse CdSe/CdS core/shell nanocrystals using air-stable reagents via successive ion layer adsorption and reaction." *J. Am. Chem. Soc.*, 125, 12567 (2003).

What is claimed is:

1. A method for doping nanocrystals, comprising the steps of:
synthesizing a starting host particle having a first radius;
incorporating impurity atoms onto a surface of the starting host particle in the presence of doping precursors to form a doped starting host particle;
purifying the doped starting host particle by removing unreacted dopants from the doped starting host particle to form a purified doped starting host particle; and
growing a host shell around the purified doped starting host particle to form a doped nanocrystal having a second radius,
wherein the impurity atoms are radial-positioned at the first radius.

2. The method according to claim 1, wherein synthesizing a starting host particle comprises growing the starting host particle until the starting host particle achieves a predetermined first radius.

3. The method according to claim 1, further comprising:
controlling relative impurity atom position by selection of the first radius and the second radius upon growing the host shell.

4. The method according to claim 1, wherein incorporating impurity atoms onto the surface of the starting host particle, comprises:
exposing the starting host particle having the first radius to a doping solution comprising the doping precursors for a selected time at a selected reaction temperature,
wherein the purifying of the doped starting host particle is performed after exposing the starting host particle having the first radius to the doping solution comprising the doping precursors for the selected time at the selected reaction temperature.

5. The method according to claim 4, wherein the doping solution comprises the doping precursors, host precursors, and a selected solvent, wherein the doping precursors have a higher reactivity than the host precursors initially incorporating the impurity atoms at the first radius and subsequently growing the host shell.

6. The method according to claim 5, further comprising controlling a doping level by the amount of doping precursors in the doping solution, the reactivity of the doping precursors, the molar ratio of doping precursors to host precursors, the selected reaction temperature, the selected time, and/or the selected solvent, wherein controlling the doping level provides a desired concentration of impurity atoms around the starting host particle.

7. The method according to claim 4, wherein the doping precursors form the impurity atoms at the first radius; wherein the host shell is grown in the presence of host precursors; and wherein during the growing of the host shell, host precursors form the host shell without replacement of the impurity atoms.

8. The method according to claim 4, wherein the selected reaction temperature is between about 20° C. and about 350° C.

9. The method according to claim 1, wherein growing the host shell comprises using a host precursor having a reactivity that is capable of replacing impurity atoms at the first radius but at a host precursor concentration and at a growth temperature such that the host shell grows at a rate faster than replacement of the impurity atoms at the first radius, wherein the host precursor concentration is below a concentration of the host precursor where nucleation of particles consisting of only material of the host shell occurs, wherein the growth temperature is less than about 350° C.

10. The method according to claim 1, wherein the starting host particle comprises a first metal chalcogenide and the host shell comprises a second metal chalcogenide.

11. The method according to claim 10, wherein the host particle comprises CdS, the impurity atom is Mn, and the host shell comprises ZnS.

12. The method according to claim 1, wherein the starting host particle comprises a core of a first metal chalcogenide of a third radius, the third radius smaller than the first radius, and a host particle shell comprising a second metal chalcogenide surrounding the core.

13. The method according to claim 12, wherein the core comprises CdS, the host particle shell comprises ZnS, the impurity atom is Mn, and the host shell comprises ZnS.

14. The method according to claim 1, wherein purifying the doped starting host particle comprises:
precipitating the doped starting host particle to separate the unreacted dopants; and
re-dispersing the precipitated doped starting host particle in a solution without the unreacted dopants.

15. The method according to claim 14, wherein growing the host shell around the purified doped starting host particle comprises:
adding the purified doped starting host particle to a growth solution comprising host precursors after re-dispersing the precipitated doped starting host particle.

* * * * *